US012672297B2

(12) United States Patent
Li et al.

(10) Patent No.:    US 12,672,297 B2
(45) Date of Patent:       Jun. 30, 2026

(54) HIGH ELECTRON MOBILITY TRANSISTOR (HEMT) COMPRISING STACKED NANOWIRE OR NANOSHEET HETEROSTRUCTURES

(71) Applicant: The Board of Trustees of the University of Illinois, Urbana, IL (US)

(72) Inventors: Xiuling Li, Austin, TX (US); Shaloo Rakheja, Champaign, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 812 days.

(21) Appl. No.: 17/712,683

(22) Filed: Apr. 4, 2022

(65) Prior Publication Data

US 2022/0328655 A1      Oct. 13, 2022

Related U.S. Application Data

(60) Provisional application No. 63/171,443, filed on Apr. 6, 2021.

(51) Int. Cl.
H10D 30/01          (2025.01)
H10D 30/43          (2025.01)
(Continued)

(52) U.S. Cl.
CPC ........... H10D 30/015 (2025.01); H10D 30/43 (2025.01); H10D 30/475 (2025.01);
(Continued)

(58) Field of Classification Search
CPC .... H10D 30/015; H10D 30/43; H10D 30/475; H10D 30/6735; H10D 30/4732;
(Continued)

(56) References Cited

U.S. PATENT DOCUMENTS 6,762,134 B2    7/2004  Bohn et al.
6,884,740 B2    4/2005  Hu et al.
(Continued)

FOREIGN PATENT DOCUMENTS

CA          2310155 C      5/2007

OTHER PUBLICATIONS

Ambacher et al., "Two dimensional electron gases induced by spontaneous and piezoelectric polarization in undoped and doped AlGaN/Gan heterostructures," J. Applied Physics. 87 (2000) pp. 334-342.
(Continued)

*Primary Examiner* — William B Partridge
*Assistant Examiner* — Chevy J Boegel
(74) *Attorney, Agent, or Firm* — Crowell & Moring LLP

(57)          ABSTRACT

A high electron mobility transistor (HEMT) for high frequency applications comprises: a source and a drain spaced apart on a substrate, each of the source and drain extending vertically away from the substrate; a stack of nanowire or nanosheet heterostructures suspended between the source and the drain and being vertically separated from each other, each of the nanowire or nanosheet heterostructures comprising a channel layer between top and bottom barrier layers; a gate dielectric layer on each nanowire or nanosheet heterostructure; and a gate electrode on each gate dielectric layer. Each of the channel layers comprises a first group III nitride including aluminum, and each of the top and bottom barrier layers comprises a second group III nitride including a higher amount of aluminum than the first group III nitride. The stack includes N of the nanowire or nanosheet heterostructures, where N is an integer from 2 to 50.

21 Claims, 15 Drawing Sheets

(51) Int. Cl.
  H10D 30/47 (2025.01)
  H10D 30/67 (2025.01)
  H10D 62/10 (2025.01)
  H10D 62/85 (2025.01)

(52) U.S. Cl.
  CPC ....... H10D 30/6735 (2025.01); H10D 62/121 (2025.01); H10D 62/8503 (2025.01)

(58) Field of Classification Search
  CPC .............. H10D 30/014; H10D 62/121; H10D 62/8503; H10D 64/691; B82Y 10/00
  See application file for complete search history.

(56) References Cited

U.S. PATENT DOCUMENTS

| | | | |
|---|---|---|---|
| 9,224,809 | B2 | 12/2015 | Li et al. |
| 9,614,060 | B2 | 4/2017 | Kim et al. |
| 10,312,350 | B1 | 6/2019 | Cheng et al. |
| 2007/0194354 | A1* | 8/2007 | Wu ....................... H10D 64/111 257/E29.093 |
| 2011/0227093 | A1* | 9/2011 | Hikita .................. H10D 30/475 257/E29.089 |
| 2012/0292665 | A1* | 11/2012 | Marino ................ H10D 62/221 257/E21.409 |
| 2015/0263134 | A1* | 9/2015 | Lee ................... H01L 21/30612 438/151 |
| 2017/0140933 | A1 | 5/2017 | Lee et al. |
| 2018/0047813 | A1* | 2/2018 | Prechtl ................ H01L 21/0254 |
| 2020/0203488 | A1* | 6/2020 | Then .................... H10D 62/824 |

OTHER PUBLICATIONS

Armstrong et al., "AlGaN polarization-doped field effect transistor with compositionally graded channel from $Al_{0.6}Ga_{0.4}N$ to AlN," Applied Physics Letters, 114 (2019) pp. 052103-1-025103-4.

Armstrong et al., "Ultra-wide band gap AlGaN polarization-doped field effect transistor," Japanese Journal of Applied Physics, 57, (2018) pp. 074103-1-074103-5.

Baca et al., "$Al_{0.85}Ga_{0.15}N/Al_{0.7}Ga_{0.3}N$ High Electron Mobility Transistors with Schottky Gates and Large On/Off Current Ratio over Temperature," ECS Journal of Solid State Science and Technology, 6, 12, (2017) pp. Q161-Q165.

Baca et al., "Al-rich AlGaN based transistors," Jour. Vac. Sc. & Tech. A, 38, 020803 (2020) pp. 1-28.

Baca et al., RF Performance of $Al_{0.85}Ga_{0.15}N/Al_{0.70}Ga_{0.30}N$ High Electron Mobility Transistors With 80-nm Gates, IEEE Electron Device Letters, 40, 1 (2019) pp. 17-20.

Bajaj et al., Modeling of high composition AlGaN channel high electron mobility transistors with large threshold voltage, Appl. Phys. Lett. 105, (2014), pp. 263503-1 to 263503-4.

Hu et al., "Doped Barrier $Al_{06.5}Ga_{0.35}N/Al_{0.40Ga0.60}N$ MOSHFET With $SiO_2$ Gate-Insulator and Zr-Based Ohmic Contacts," IEEE Electron Device Letters, 39, 10, (2018) pp. 1568-1561.

Jo et al., "Control of transconductance in high performance AlGaN/GaNFinFETs," 2015 IEEE 11th International Conference on Power Electronics and Drive Systems (2015) pp. 684-686.

Lee et al., "Nanowire Channel InAlN/GaN HEMTs With High LInearity of $g_m$ and $f_T$," IEEE Electron Device Letters 34, 8 (2013) pp. 969-971.

Lemettinen et al., "Nitrogen-Polar Polarization-Doped Field-Effect Transistor Based on $Al_{0.8}Ga_{0.2}N/AlN$ on SiC With Drain Current Over 100 mA/mm," IEEE Electron Device Letters, 40, 8 (2019) pp. 1245-1248.

Li et al., "An analytic current-voltage model for quasiballistic III-nitride high electron mobility transistors," Applied Physics Letters, 115, (2019) pp. 184501-1184501-13.

Loubet et al., A Novel Dry Selective Etch of SiGe for the Enablement of High Performance Logic Stacked Gate-All-Around Nano Sheet Devices, Conference Paper, IEDM19 (2019) pp. 242-245.

Muhtadi et al. High Electron Mobility Transistors With $Al_{0.65}Ga_{0.35}N$ Channel Layers on Thick AlN/Sapphire Templates, IEEE Electron Device Letters, 38, 7 (2017) pp. 914-917.

Razzak et al., "Design of compositionally graded contact layers for MOCVD grown high Al-content AlGaN transistors," Applied Physics Letters 115, (2019) pp. 043502-1-043502.5.

Song et al., "III-V Junctionless Gate-All-Around Nanowire MOSFETs for High Linearity Low Power Applications", IEEE Electron Dev. Lett. 35, 3, (2014) pp. 324-326.

Song et al., "Vertically stacked individually tunable nanowire field effect transistors for low power operation with ultrahigh radio frequency linearity" Applied Physics Letters, 101, 093509 (2012) pp. 1-5.

Xing et al. "Panar-Nanstrip-Channel InAlN/GaNHEMTs on Si With Improved $g_m$ and $f_T$ Linearity." IEEE Electron Device Letters 38, 5 (2017) pp. 619-622.

Xu et al, "$Al_{0.75}Ga_{0.25}N/Al_{0.6}Ga_{0.4}N$ heterojunction field effect transistor with $f_T$ of 40 GHz," Appl. Phys. Express 12, (2019) pp. 066502-1-066502.5.

* cited by examiner

NANOSHEET MOSFET
SETUP (DUAL GATE)

NANOSHEET MOSHEMT
(DUAL GATE)

HIGH ELECTRON MOBILITY TRANSISTOR (HEMT) COMPRISING STACKED NANOWIRE OR NANOSHEET HETEROSTRUCTURES

RELATED APPLICATION

The present patent document claims the benefit of priority under 35 U.S.C. 119(e) to U.S. Provisional Patent Application No. 63/171,443, which was filed on Apr. 6, 2021, and is hereby incorporated by reference in its entirety.

TECHNICAL FIELD

The present disclosure is related generally to transistor technology and more specifically to new configurations for ultra-wide bandgap materials and transistors.

BACKGROUND

As a result of the continually growing demand for wireless signals, the electromagnetic spectrum has become MV/cm), enabling much higher operating voltages and great output power in the same form factor compared to WBG semiconductors. At the same time, UWBG materials have excellent electron transport characteristics (e.g., high electron mobility and velocity). Hence, the relevant high-frequency figure of merit, called the Johnson FOM (product of breakdown voltage and cut-off frequency) for UWBG materials such as Al-rich AlGaN and AlN, is up to five times better than state-of-the-art WBG GaN material systems. This suggests UWBG materials may be at least 3 orders of magnitude better than silicon and gallium arsenide for high-power and high-frequency applications. Owing to their large bandgap, ability to host polarization-induced two-dimensional electron gas (2DEG), and superior electron transport properties at high temperatures, ultrawide bandgap (UWBG) Al-rich AlGaN semiconductors have become an attractive candidate for efficient power amplification at high frequencies; see Table 1.

TABLE 1

| Comparison of material characteristics of various Group III nitrides. | | | | |
|---|---|---|---|---|
| Material Characteristics (300 K) | GaN | $Al_{0.3}Ga_{0.7}N$ | $Al_{0.5}Ga_{0.5}N$ | AlN |
| Bandgap (eV) | 3.4 | 4.0 | 4.5 | 6.0 |
| Polarization-induced 2DEG density, $n_s$ $(C/m^2)$ | 0.029 | 0.044 | 0.055 | 0.081 |
| 2DEG mobility, $\mu$ $(cm^2/Vs)$ | 1500 | 250 | 100 | 1400 |
| Saturation velocity of electrons, $v_{sat}$ $(\times 10^7$ cm/s) | 1.79 | 1.20 | 1.14 | 2.20 |
| Breakdown electric field, $E_{crit}$ (MV/cm) | 3.7 | 5.6 | 6.4 | 16.6 |
| Thermal conductivity, $K_{th}$ (W/cm · K) | 130 | 20 | 19 | 285 |
| Johnson figure of merit (Cutoff frequency × Breakdown voltage) (normalized to GaN) | 1 | 1 | 1.1 | 5.5 | crowded. An expedient route toward overcoming the spectrum scarcity is to create key components of wireless transceivers, such as power amplifiers, using new semiconductor technologies that can operate at near-terahertz frequencies (>90 GHz), while also delivering high output power on the order of tens of watts per millimeter. The frequency range of 90-1000 GHz is a key part of the electromagnetic spectrum for many applications, including beyond 5G wireless communications and sensing. Conventional wide bandgap (WBG) semiconductors, such as GaN, have limited prospects in the 90-1000 GHz frequency range due to an insufficiently large bandgap and known thermal issues. On the other hand, ultrawide bandgap (UWBG) semiconductors with bandgaps in excess of 4 eV may be able to advance the power density and operation frequency significantly over existing semiconductor technologies. This is because UWBG semiconductors suffer from band-to-band ionization only at very high electric fields (around 10

However, new device architectures that can fully harness the material level-benefits of UWBG materials may be crucial to enable the next-generation high-power radiofrequency (RF) electronics with significant size, weight, power, and cost benefits.

BRIEF SUMMARY

A high electron mobility transistor (HEMT) for high frequency applications and methods of the making the HEMT are described herein, along with a heterostructure stack for an electronic device.

The HEMT comprises a source and a drain spaced apart on a substrate, where each of the source and drain extends vertically away from the substrate; a stack of nanowire or nanosheet heterostructures suspended between the source and the drain and being vertically separated from each other, where each of the nanowire or nanosheet heterostructures comprises a channel layer between top and bottom barrier layers; a gate dielectric layer on each nanowire or nanosheet heterostructure; and a gate electrode on each gate dielectric layer. Each of the channel layers comprises a first group III nitride including aluminum, and each of the top and bottom barrier layers comprises a second group III nitride including a higher amount of aluminum than the first group III nitride. The stack includes N of the nanowire or nanosheet heterostructures, where N is an integer from 2 to 50.

According to one aspect, a method of making a HEMT includes: epitaxially growing a stack of layers on a substrate, the stack of layers including N sacrificial layers comprising a sacrificial material alternating with N heterostructure layers, each of the heterostructure layers comprising a first group III nitride and a second group III nitride, where N is an integer and $2 \leq N \leq 50$; forming a source and a drain on the substrate alongside the stack of layers on a first side and a second side thereof, respectively, the stack of layers connecting the source and the drain; removing the sacrificial layers comprising the sacrificial material so as to isolate the heterostructure layers, thereby forming a stack of nanosheet heterostructures suspended between the source and the drain and being vertically separated from each other; forming a gate dielectric layer on each of the nanosheet heterostructures; and forming a gate electrode on the gate dielectric layer.

According to another aspect, a method of making a HEMT includes: epitaxially growing a stack of layers on a substrate, the stack of layers including N sacrificial layers comprising a sacrificial material alternating with N heterostructure layers, each of the heterostructure layers comprising a first group III nitride and a second group III nitride, where N is an integer and $2 \leq N \leq 50$; forming a source and a drain on the substrate alongside the stack of layers on a first side and a second side thereof, respectively, the stack of layers connecting the source and the drain; removing material from a third side and a fourth side of the stack of layers to define a stack of wires of a predetermined width connecting the source and the drain, the stack of wires comprising sacrificial nanowires of the sacrificial material alternating with heterostructure nanowires comprising the first group III nitride and the second group III nitride; and removing the sacrificial nanowires comprising the sacrificial material so as to isolate the heterostructure nanowires, thereby forming a stack of nanowire heterostructures suspended between the source and the drain and being vertically separated from each other; forming a gate dielectric layer on each of the nanowire heterostructures; and forming a gate electrode on the gate dielectric layer.

A heterostructure stack for an electronic device comprises: first and second electrodes spaced apart on a substrate, where each of the first and second electrodes extends vertically away from the substrate; and a stack of nanowire or nanosheet heterostructures suspended between the first and second electrodes, where the nanowire or nanosheet heterostructures are vertically separated from each other. Each of the nanowire or nanosheet heterostructures comprises at least a first wide bandgap semiconductor and a second wide bandgap semiconductor, and the stack includes N of the nanowire or nanosheet heterostructures, where N is an integer from 2 to 50.

DETAILED DESCRIPTION

In this disclosure, group III-nitride ("III-nitride") materials are employed as the underlying material technology to create new three-dimensional (3D) stacked nanowire or nanosheet architectures that promise at least an order of magnitude performance improvement compared to existing WBG devices. In addition, the concept of using stacked architectures can be applied to other semiconductor heterojunctions for applications in a wide range of electronic or photonic devices and sensors.

Figure 1:
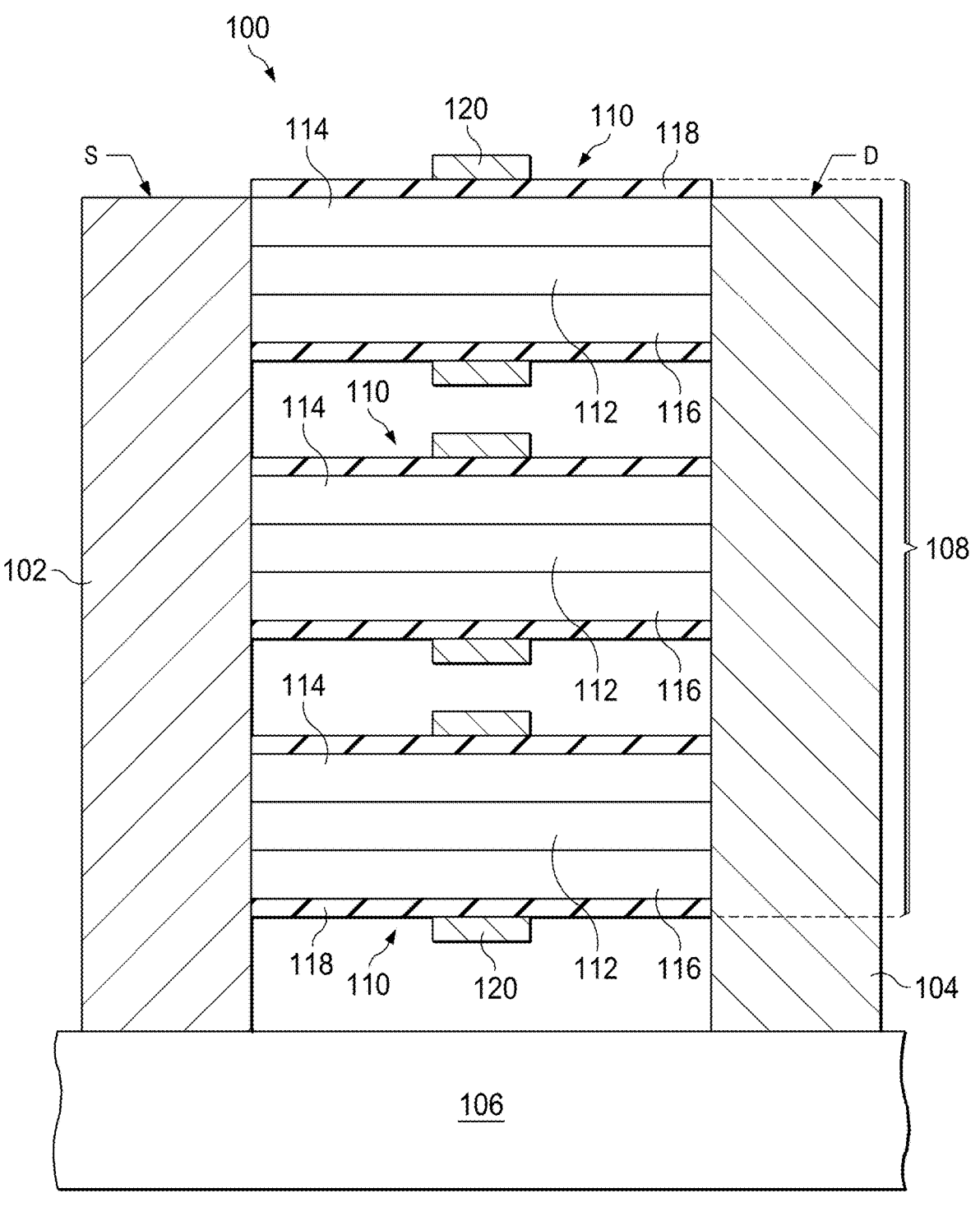
FIG. 1 is a schematic of an exemplary high electron mobility transistor (HEMT) comprising a stack of vertically separated nanowire or nanosheet heterostructures.

Referring to FIG. 1, a high electron mobility transistor (HEMT) 100 for high frequency applications includes a source 102 and a drain 104 spaced apart on a substrate 106, where each of the source 102 and drain 104 extends vertically away from the substrate 106. A stack 108 of nanowire or nanosheet heterostructures 110 is suspended between the source and the drain. The stack may include N of the nanowire or nanosheet heterostructures 110, where N is an integer from 2 to 100, or from 2 to 50. The nanowire or nanosheet heterostructures 110 are vertically separated from each other, and each heterostructure 110 comprises a channel layer 112 between top and bottom barrier layers 114,116. Each of the channel layers 112 comprises a first group III nitride including aluminum, and each of the top and bottom barrier layers 114,116 comprises a second group III nitride including a higher amount or proportion of aluminum than the first group III nitride. For example, the first group III nitride may include from about 30 at. % Al to about 50 at. % Al relative to a total amount of group III (non-nitrogen) elements, and the second group III nitride may include from about 60 at. % Al to about 100 at. % Al, or from about 60 at. % Al to about 90 at. % Al, relative to the total amount of group III (non-nitrogen) elements. A gate dielectric layer 118 is disposed on each nanowire or nanosheet heterostructure 110, and a gate electrode 120 is disposed on each gate dielectric layer 118. The nanowire or nanosheet heterostructures 110 may be vertically separated from each other by a distance in a range from about 10 nm to about 100 nm.

Generally speaking, "group III" elements may be understood to include aluminum (Al), gallium (Ga), indium (In), boron (B), and scandium (Sc). The first group III nitride and the second group III nitride may be selected from aluminum nitride, aluminum scandium nitride, aluminum indium scandium nitride, aluminum boron nitride, aluminum boron gallium nitride, aluminum boron scandium nitride, aluminum gallium nitride, and/or aluminum scandium gallium nitride. The term "heterostructure" may be understood to refer to a multilayer structure including two or more semiconductor materials (e.g., the first and second group III nitrides referred to above) separated by one or more interfaces, or heterojunctions. The interfaces define separate layers (e.g., the channel layer 112 and the top and bottom barrier layers 114,116 referred to above) of the multilayer structure.

The stack 108 of nanowire or nanosheet heterostructures 110 may include N channel layers, that is, from 2 to 50 (or more) channel layers. The composition and/or thickness of the channel layers 112 may be individually varied across the stack 108, if desired. Alternatively, the composition and/or thickness of the channel layers 112 may remain constant across the stack 108. Similarly, the stack 108 of nanowire or nanosheet heterostructures 110 may include N top barrier layers 114 and N bottom barrier layers 116, that is, from 2 to 50 (or more) top barrier layers 114 and from 2 to 50 (or more) bottom barrier layers 116. The composition and/or thickness of each of the top and bottom barrier layers 114,116 may be individually varied across the stack 108, if desired, or may remain constant across the stack 108. Since, for a given nanowire or nanosheet heterostructure 110, the second group III nitride of the top and bottom barrier layers 114, 116 includes a higher amount or proportion of aluminum than the first group III nitride of the channel layer 112, the difference between the amount of aluminum in the channel layer 112 and the respective top and bottom barrier layers 114,116 may also be individually varied (or may remain constant) across the stack 108. In addition, the vertical separation between the nanowire or nanosheet heterostructures 110 may be individually varied or may remain constant across the stack 108. High linearity may be achieved since the nanowire or nanosheet heterostructures are individually tunable in terms of both structure and composition. Independent geometry engineering of the nanowire or nanosheet heterostructures combined with alloy composition control may permit control over bandgap and 2D electron gas density, as described below.

As an example of composition control across the stack 108, the channel layers 112 of the nanowire or nanosheet heterostructures 110 may collectively comprise at least two different compositions of the first group III nitride. Also or alternatively, the channel layers 112 of the nanowire or nanosheet heterostructures 110 may collectively comprise up to N different compositions of the first group III nitride. In one example, the first group III nitride may comprise $Al_xGa_{1-x}N$, where $x \geq 0.3$, or more specifically, $0.3 \leq x \leq 0.5$. In other words, as described above, the first group III nitride may include from about 30 at. % Al to about 50 at. % Al relative to a total amount of group III (non-nitrogen) elements. The channel layers 112 of the nanowire or nanosheet heterostructures 110 may collectively comprise at least two different values of x. Also or alternatively, the channel layers 112 of the nanowire or nanosheet heterostructures 110 may collectively comprise up to N different values of x.

As an example of structure control across the stack 108, the channel layers 112 of the nanowire or nanosheet heterostructures 110 may collectively comprise at least two different thicknesses. Also or alternatively, the channel layers 112 of the nanowire or nanosheet heterostructures 110 may collectively comprise up to N different thicknesses. In one example, each of the channel layers 112 may have a thickness in a range from about 4 nm to about 20 nm.

In another example of composition control across the stack 108, the top and bottom barrier layers 114,116 of the nanowire or nanosheet heterostructures 110 may collectively comprise at least two different compositions of the second group III nitride. Also or alternatively, the top and bottom barrier layers 114,116 of the nanowire or nanosheet heterostructures 110 may collectively comprise up to N different compositions of the second group III nitride. In one example, the second group III nitride of the top and bottom barrier layers 114,116 may comprise $Al_yR_zGa_{1-y-z}N$, wherein $0.6 \leq y \leq 1.0$, $0 \leq z \leq 0.4$, and R is B and/or Sc. In some examples, $0.6 \leq y \leq 0.9$. In other words, as described above, the second group III nitride may include from about 60 at. % Al to about 100 at. % Al, or from about 60 at. % Al to about 90 at. % Al, relative to the total amount of group III (non-nitrogen) elements. The top and bottom barrier layers 114,116 of the nanowire or nanosheet heterostructures 110 may collectively comprise at least two different values of y and/or at least two different values of z. Also or alternatively, the top and bottom barrier layers 114,116 of the nanowire or nanosheet heterostructures 110 may collectively comprise up to N different values of y and/or up to N different values of z.

In another example of structure control across the stack 108, the top and bottom barrier layers 114,116 of the nanowire or nanosheet heterostructures 110 may collectively comprise at least two different thicknesses. Also or alternatively, the top and bottom barrier layers of the nanowire or nanosheet heterostructures 110 may collectively comprise up to N different thicknesses. In one example, each of the top and bottom barrier layers 114,116 may have a thickness in a range from about 4 nm to about 20 nm.

Figure 2A:
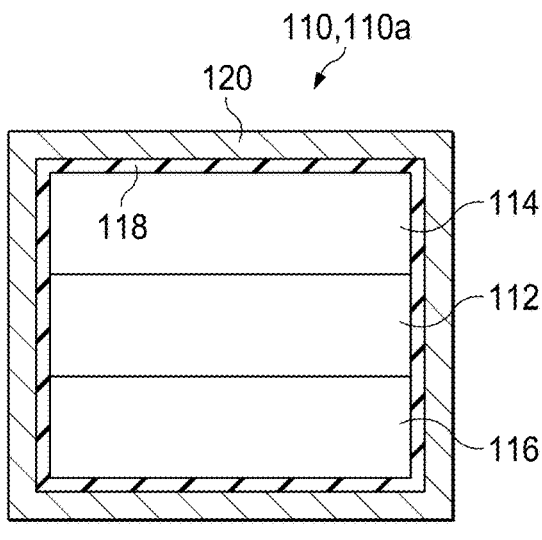
FIG. 2A shows a cross-sectional view of an exemplary nanowire heterostructure surrounded by a gate electrode in a gate-all-around configuration.
Figure 3:
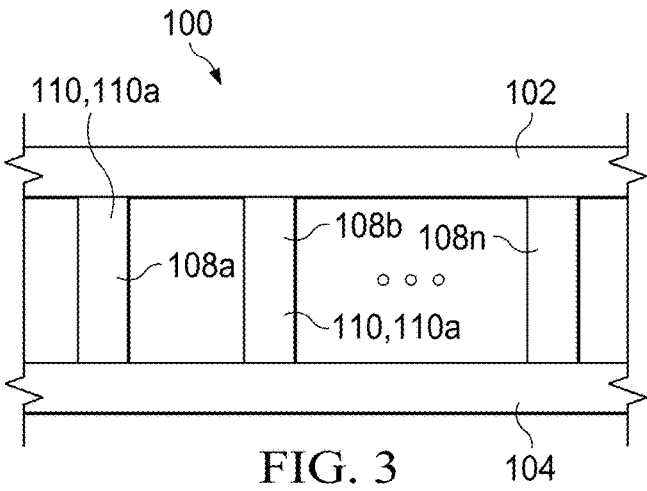
FIG. 3 shows a top-view schematic of a HEMT that includes multiple stacks of nanowire heterostructures laterally spaced apart from each other and suspended between a source and a drain.

The stack 108 of nanowire or nanosheet heterostructures 110 may be a stack 108 of nanowire heterostructures 110a, where each of the nanowire heterostructures 110a may have a width comparable to a thickness thereof. For example, both the width and the thickness may be less than about 50 nm, and more typically less than about 20 nm (e.g., in a range from about 10 nm to about 50 nm); it is understood that the nanowire heterostructures 110 have a length defined by the distance between the source 102 and the drain 104. In such an example, the gate electrode 120 may surround each of the nanowire heterostructures 110a, such that the gate electrode 120 has a gate-all-around configuration, as shown by the cross-sectional schematic of FIG. 2A. The stack 108 of nanowire heterostructures 110 may constitute a first stack 108a, and the HEMT 100 may further comprise a second stack 108b of nanowire heterostructures 110 laterally spaced apart from the first stack 108a and suspended between the source 102 and the drain 104, as illustrated in top-view schematic of FIG. 3. Similar to the first stack 108a, the nanowire heterostructures 110 of the second stack 108b are vertically separated from each other, although the vertical separation is not visible in this schematic. FIG. 3 shows that the HEMT 100 may comprise additional stacks 108n as desired, where the individual variability of the nanowire heterostructures 110a, as described above, may apply to any or all of the stacks 108a,108b,108n.

Figure 2B:
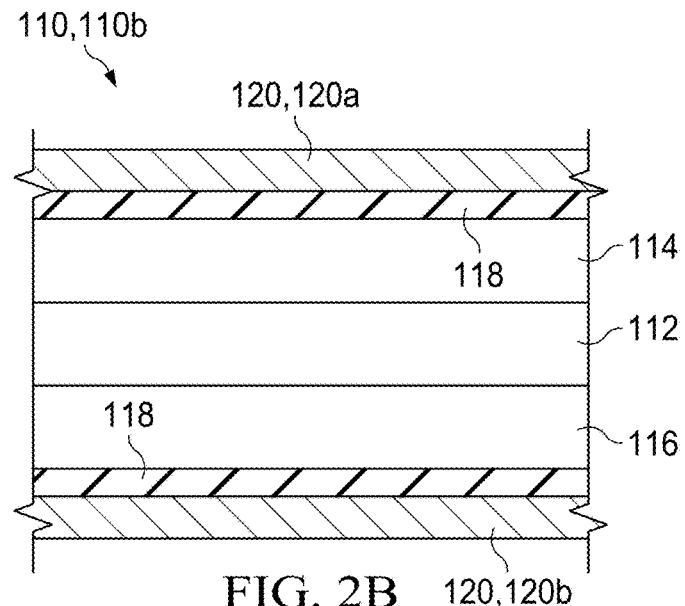
FIG. 2B shows a cross-sectional view of an exemplary nanosheet heterostructure sandwiched between top and bottom gates in a dual-gate configuration.

Alternatively, referring to FIG. 2B, the stack 108 of nanowire or nanosheet heterostructures 110 may be a stack 108 of nanosheet heterostructures 110b, where each of the nanosheet heterostructures 110b has a width much larger than a thickness thereof, and where the length of the nanosheet heterostructures 110b is defined by the distance between the source 102 and the drain 104. Each nanosheet heterostructure 110b may have a width that is at least about five times as large, or at least about ten times as large, as the thickness. The width and the length of the nanosheet heterostructures 110b may be comparable. In such an example, the gate electrode 120 may comprise a top gate 120a overlying each nanosheet heterostructure 110b and a bottom gate 120b underlying each nanosheet heterostructure 110b, such that the top and bottom gates 120a,120b have a dual gate configuration, as shown in FIG. 2B.

The gate dielectric layer 118 may comprise $Al_2O_3$ and/or $HfZrO_2$. The gate dielectric layer may have a thickness in a range from about 2 nm to about 10 nm, and/or a length in a range from about 30 nm to about 70 nm.

Typically, the substrate comprises GaN. The source 102 and the drain 104 may comprise $In_xGa_{1-x}N$, wherein $0 \leq x \leq 0.5$. In some examples, the source 102 and the drain 104 may have a graded composition where x increases in a direction away from the substrate and, in some examples, may vary from 0 to 0.5. The $In_xGa_{1-x}N$ may include Si, Te, and/or Se as a dopant. The $In_xGa_{1-x}N$ may be heavily doped, e.g., the $In_xGa_{1-x}N$ may include the dopant at a concentration of at least about $1 \times 10^{18}/cm^3$.

Each nanowire or nanosheet heterostructure 110 may comprise a 2D electron gas (2DEG). The 2DEG may form at the interface (or heterojunction) between the top barrier layer 114 and the channel layer 112, and/or at the interface (or heterojunction) between the bottom barrier layer 116 and the channel layer 112. Consequently, the nanowire or nanosheet heterostructures 110 may be undoped; that is, an intentional dopant may not be required to achieve a large interface charge density.

The uniqueness and advantages of the technology may include the achievement of high frequency by the suspended heterostructure stack which includes the 2DEG mentioned above, where the heterojunctions unique to compound semiconductors may form top and bottom 2D electron gas (2DEG) structures. High power may be achieved by integrating high $E_g$ strained materials. There may be a relaxed thickness requirement in each layer in the compound semiconductor heterojunctions at least in part due to the absence of a doping requirement. This allows strain accommodation of mismatched materials that otherwise might crack or produce other detrimental defects. High linearity may be achieved since the stack is individually tunable. The bandgap and 2DEG density may be tuned via the independent geometry engineering of the nanowire or nanosheet heterostructures combined with alloy composition tuning. The vertical separation (or air-bridge formation) between nanowire or nanosheet heterostructures may be achieved by selective lateral etching using, for example, metal-assisted chemical etch (MacEtch). Superior gate control of the 2DEG may be achieved due to vertical scalability and use of a novel dielectric for on-off current ratio. Also advantageous is etching and regrowing the source and drain with, for example, a heavily-doped graded alloy composition starting with lattice matched material at the bottom of the source/drain etched trench, and then grading to lower energy materials for tunneling junction to reduce contact resistance.

Due to the above-described structure and composition control, the HEMT 100 may comprise a cut-off frequency of at least about 25 GHz, at least about 65 GHz, at least about 105 GHz, or at least about 145 GHz. Also or alternatively, the HEMT 100 may have a maximum output power of at least about 300 mW/mm, at least about 700 mW/mm, at least about 1 W/mm, or at least about 1.5 W/mm per nanowire or nanosheet heterostructure. The HEMT may further comprise a total maximum output power of N times the maximum output power. The HEMT may exhibit high linearity; for example, over a gate bias ($V_{gs}$) range of at least about 300 mV, a transconductance ($g_m$) of the HEMT may decrease less than about 10% from a maximum transconductance ($g_{m,max}$). A power amplifier for use at frequencies above 90 GHz may include the HEMT as described above according to any embodiment or example.

While particularly useful for HEMTs, the stacked nanowire and nanosheet heterostructure technology is generally applicable to a wide range of electronic, photonic and/or sensing devices, such as, field effect transistors, MOSFETs, bipolar junction transistors, light emitting diodes, lasers, and/or solar cells. A heterostructure stack for such an electronic device may comprise first and second electrodes spaced apart on a substrate, where each of the first and second electrodes extends vertically away from the substrate. A stack of nanowire or nanosheet heterostructures may be suspended between the first and second electrodes. The stack may include N of the nanowire or nanosheet heterostructures, where N being an integer from 2 to 50. The nanowire or nanosheet heterostructures may be vertically separated from each other, and each of the nanowire or nanosheet heterostructures may comprise at least a first wide bandgap semiconductor and a second wide bandgap semiconductor.

The first and second wide bandgap semiconductors may comprise aluminum antimonide, aluminum arsenide, aluminum gallium arsenide, aluminum gallium indium phosphide, aluminum gallium nitride, aluminum gallium phosphide, aluminum indium arsenide, aluminum nitride, aluminum scandium nitride, aluminum indium scandium nitride, aluminum boron nitride, aluminum boron gallium nitride, aluminum boron scandium nitride, aluminum gallium nitride, aluminum scandium gallium nitride, aluminum phosphide, boron arsenide, boron nitride, boron phosphide, gallium antimonide, gallium arsenide, gallium arsenide phosphide, gallium indium arsenide antimonide phosphide, gallium nitride, gallium phosphide, indium aluminum nitride, indium antimonide, indium arsenide, indium arsenide antimonide phosphide, indium gallium arsenide, indium gallium arsenide phosphide, indium gallium nitride, indium gallium phosphide, indium nitride, and/or indium phosphide.

Also described in this disclosure are methods of making a high electron mobility transistor (HEMT) and, more generally speaking, a heterostructure stack for an electronic device.

Figure 4A:
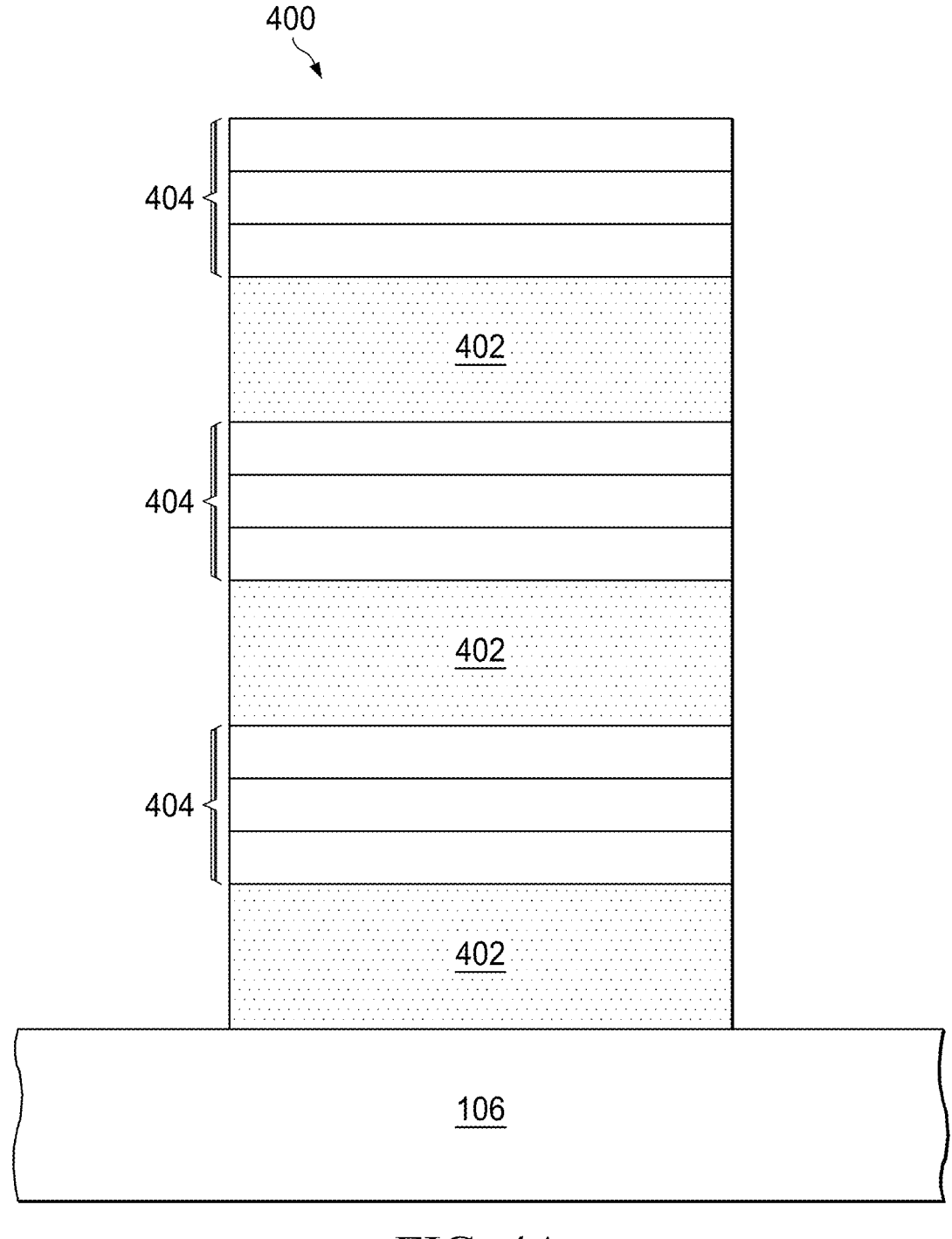
FIGS. 4A-4E are schematics illustrating steps in the fabrication of the HEMT of FIG. 1.
Figure 4B:
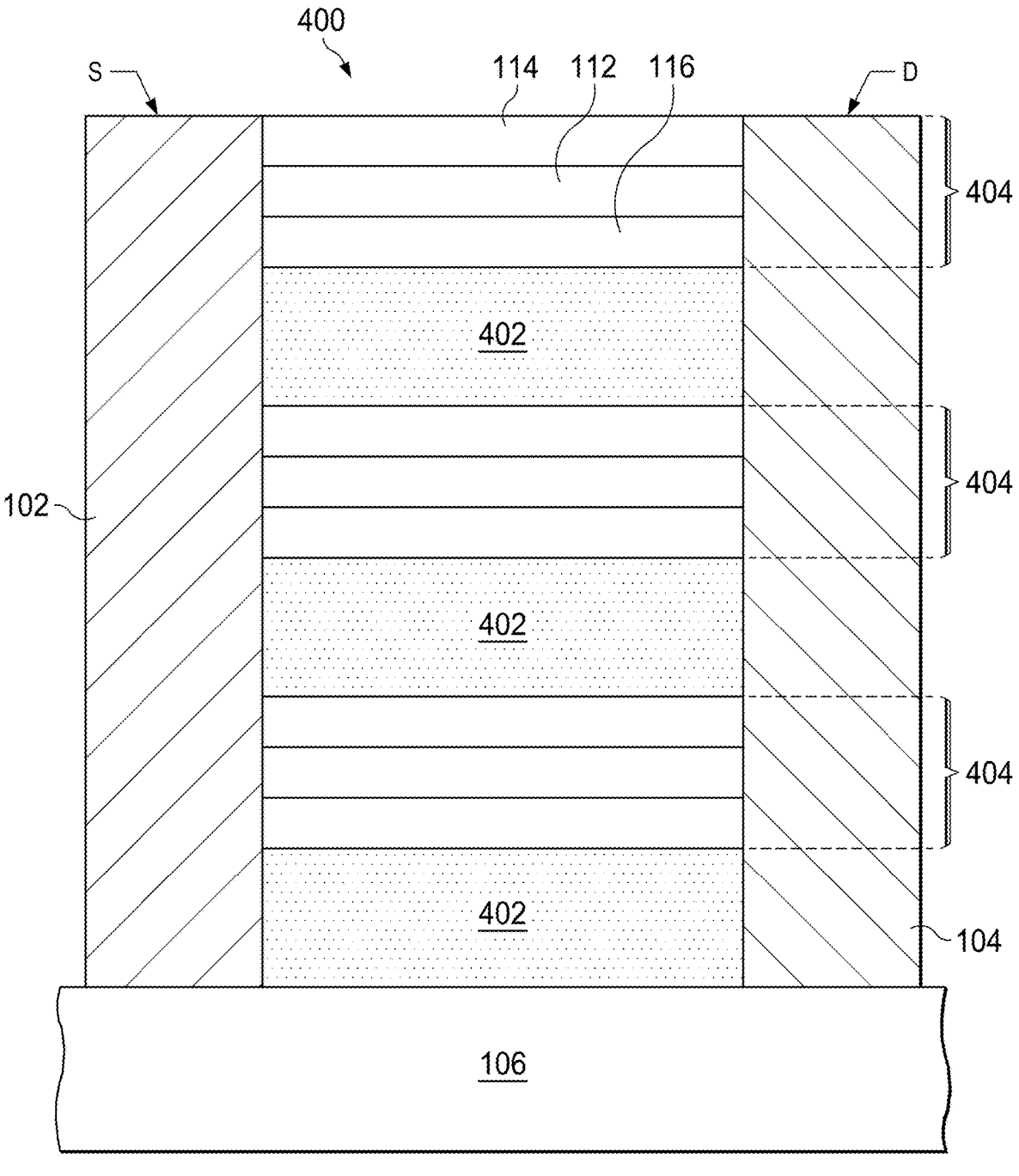
Figure 4C:
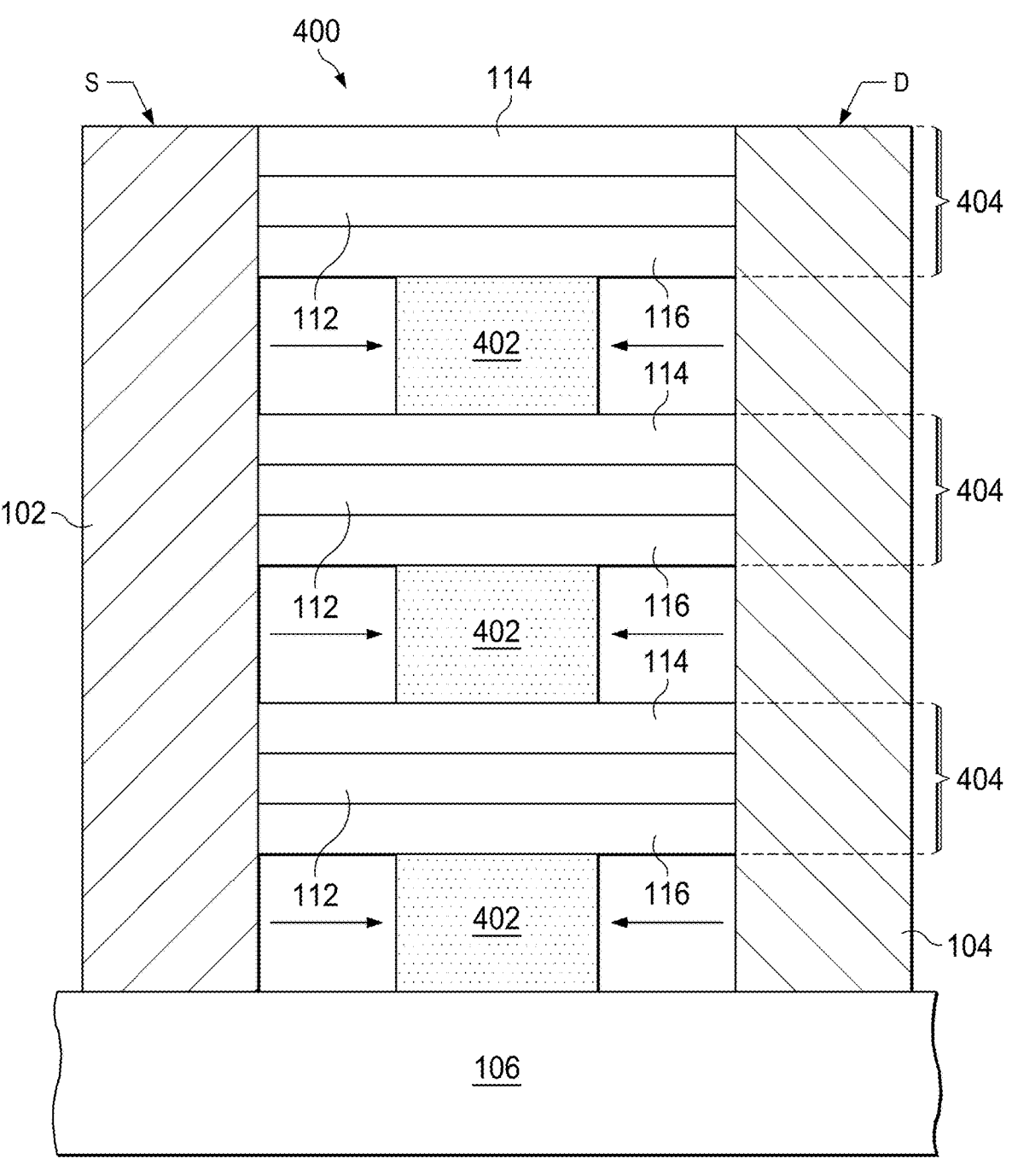
Figure 4D:
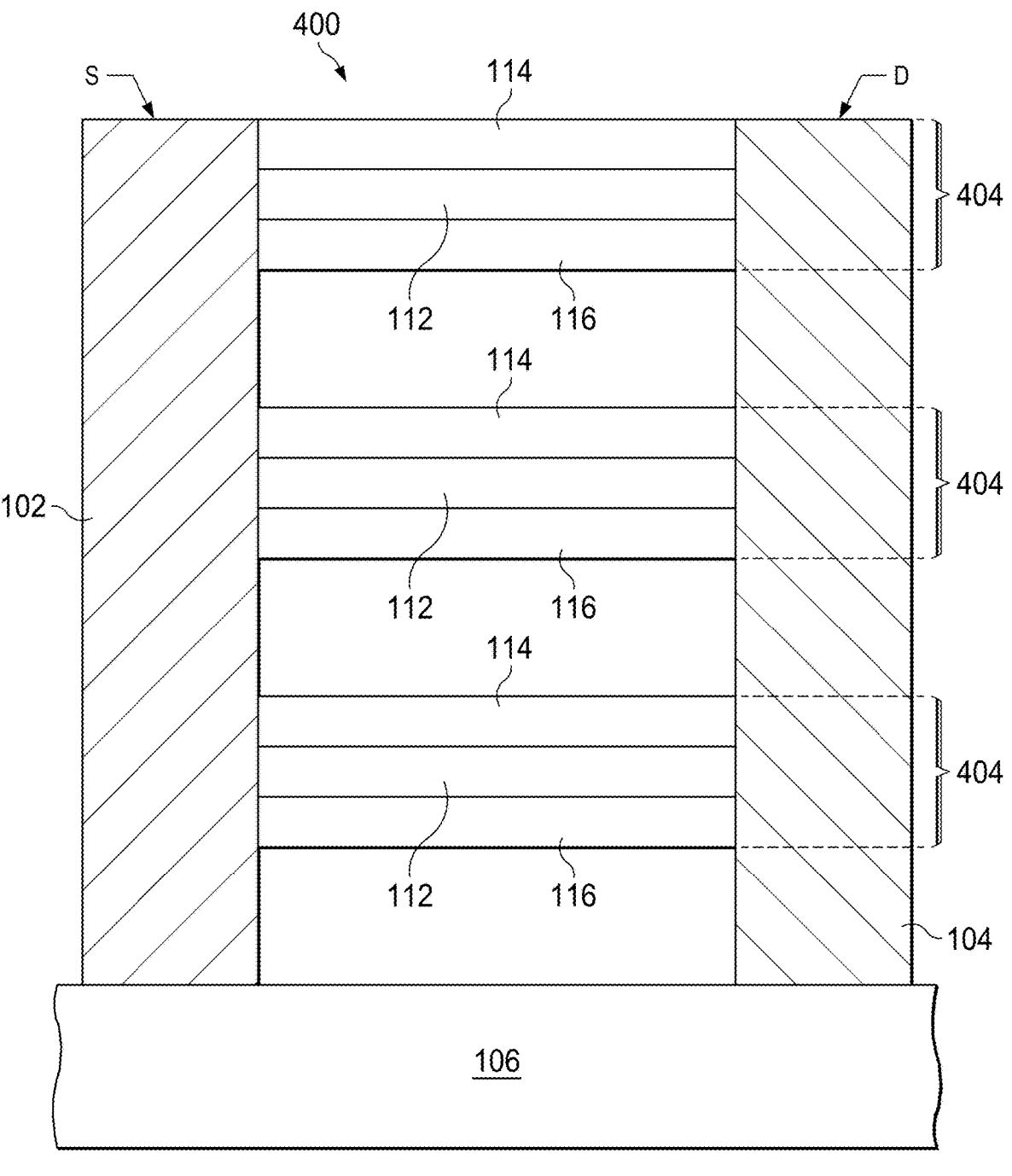
Figure 4E:
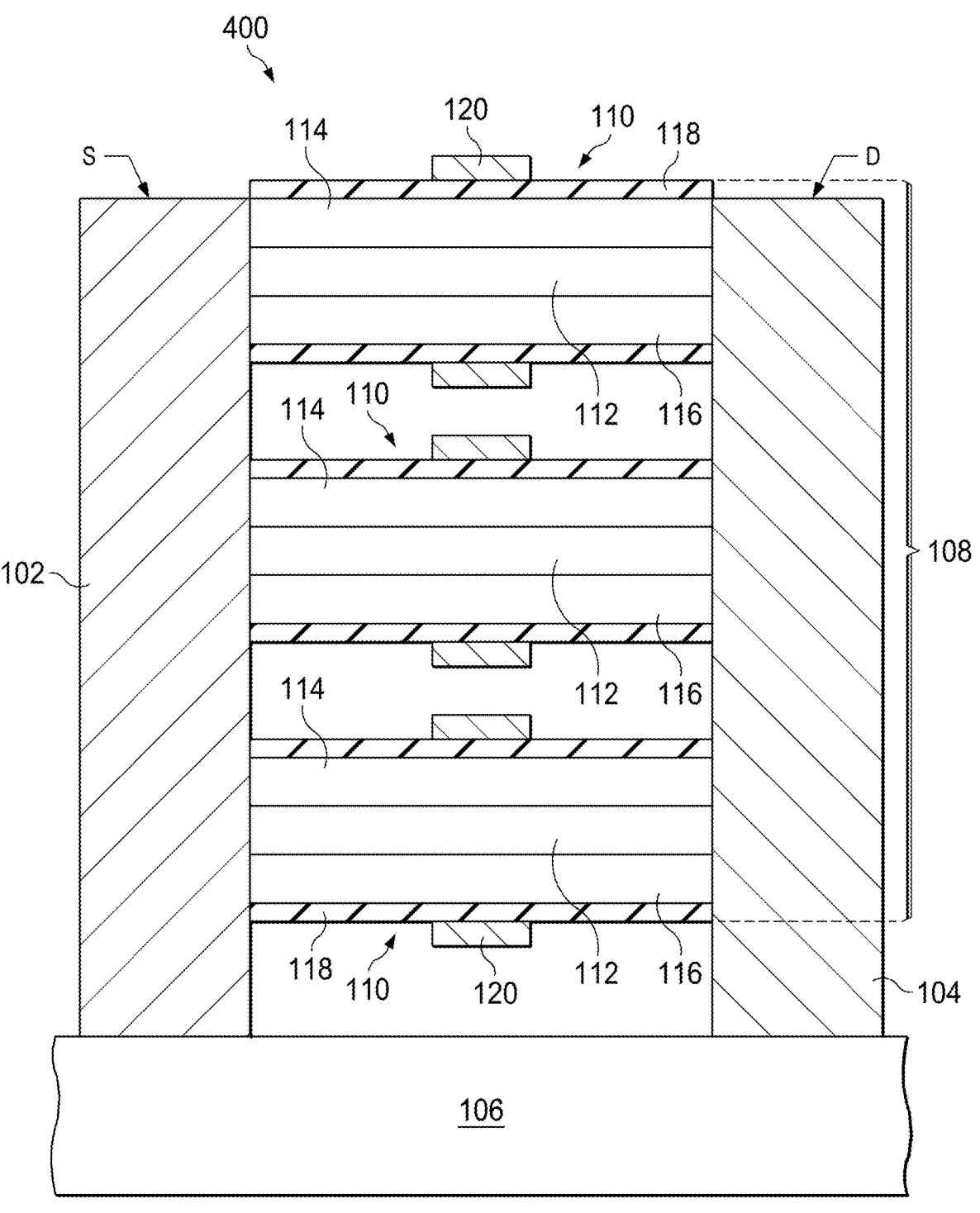

Referring to FIG. 4A, the method includes, according to a first aspect, epitaxially growing a stack 400 of layers on a substrate 106, where the stack of layers includes N sacrificial layers 402 comprising a sacrificial material alternating with N heterostructure layers 404. Each of the heterostructure layers 404 includes a first group III nitride and a second group III nitride, where N is an integer and $2 \leq N \leq 50$. Referring to FIG. 4B, a source 102 and a drain 104 are formed on the substrate 106 alongside the stack 400 of layers on a first side and a second side of the stack 400, respectively, such that the stack 400 of layers connects the source 102 and the drain 104. The sacrificial layers 402 comprising the sacrificial material are then removed, as illustrated in FIG. 4C, such that the heterostructure layers 404, which remain, are isolated. Accordingly, referring to FIG. 4D, a stack 108 of nanosheet heterostructures 110 is formed, where the nanosheet heterostructures 110 are suspended between the source 102 and the drain 104 and are vertically separated from each other. Referring to FIG. 4E, a gate dielectric layer 118 may be formed on each of the nanosheet heterostructures 110, and a gate electrode 120 may be formed on the gate dielectric layer 118. Each of the nanosheet heterostructures 110 may comprise a channel layer 112 between top and bottom barrier layers 114,116, where the channel layer 112 comprises the first group III nitride and the top and bottom barrier layers 114,116 comprise the second group III nitride.

The stack 400 of layers may be epitaxially grown using chemical vapor deposition or molecular beam epitaxy. The source 102 and drain 104 may be formed by regrowth after lithography and etching of the stack 400 of layers. As described above, the source 102 and drain 104 may have a graded composition. The sacrificial layers 402 may be removed by metal-assisted chemical etching, photoelectrochemical etching, and/or reactive ion etching. The sacrificial material of the sacrificial layers 402 may comprise a doped III-nitride material, such as n+ AlGaN. High etching selectivity is beneficial and can be designed as a function of III-nitride composition and doping. The gate dielectric layer 118 may be formed using atomic layer deposition or another vapor deposition method and may comprise an oxide such as $Al_2O_3$ and/or $HfZrO_2$. The gate electrode may be formed in a dual gate configuration, also as described above, and may comprise a metal. Generally speaking, the HEMT, the nanosheet heterostructures, the channel layer, the top and bottom barrier layers, the first group III nitride, and the second group III nitride may have any of the features described above or elsewhere in this disclosure.

The method may include, according to a second aspect, epitaxially growing a stack of layers on a substrate, where the stack of layers includes N sacrificial layers comprising a sacrificial material alternating with N heterostructure layers. Each of the heterostructure layers comprises a first group III nitride and a second group III nitride, where N is an integer and $2 \leq N \leq 50$. A source and a drain are formed on the substrate alongside the stack of layers on a first side and a second side of the stack, respectively, such that the stack of layers connects the source and the drain. Material is removed from a third side and a fourth side of the stack of layers to define a stack of wires of a predetermined width connecting the source and the drain. The stack of wires comprises sacrificial nanowires of the sacrificial material alternating with heterostructure nanowires comprising the first group III nitride and the second group III nitride. The sacrificial nanowires comprising the sacrificial material are removed such that the heterostructure nanowires, which remain, are isolated. Accordingly, a stack of nanowire heterostructures is formed, where the nanowire heterostructures are suspended between the source and the drain and vertically separated from each other. A gate dielectric layer may be formed on each of the nanowire heterostructures, and a gate electrode may be formed on the gate dielectric layer. Each of the nanowire heterostructures may comprise a channel layer between top and bottom barrier layers, where the channel layer comprises the first group III nitride and the top and bottom barrier layers comprise the second group III nitride.

The stack of layers may be epitaxially grown using chemical vapor deposition or molecular beam epitaxy. The source and the drain may be formed by regrowth after lithography and etching of the stack of layers. As described above, the source and drain may have a graded composition. The material from the third and fourth sides of the stack may be removed by wet etching and/or metal-assisted chemical etching. The sacrificial layers may be removed by metal-assisted chemical etching, photoelectrochemical etching, and/or reactive ion etching. The sacrificial material of the sacrificial layers may comprise a doped III-nitride material, such as n+ AlGaN. High etching selectivity is beneficial and can be designed as a function of III-nitride composition and doping. The gate dielectric layer may be formed using atomic layer deposition or another vapor deposition method and may comprise an oxide such as $Al_2O_3$ and/or $HfZrO_2$. The gate electrode may be formed in a gate-all-around configuration, as described above, and may comprise a metal. Generally speaking, the HEMT, the nanowire heterostructures, the channel layer, the top and bottom barrier layers, the first group III nitride, and the second group III nitride may have any of the features described above or elsewhere in this disclosure.

Computational Examples

Figure 5A:
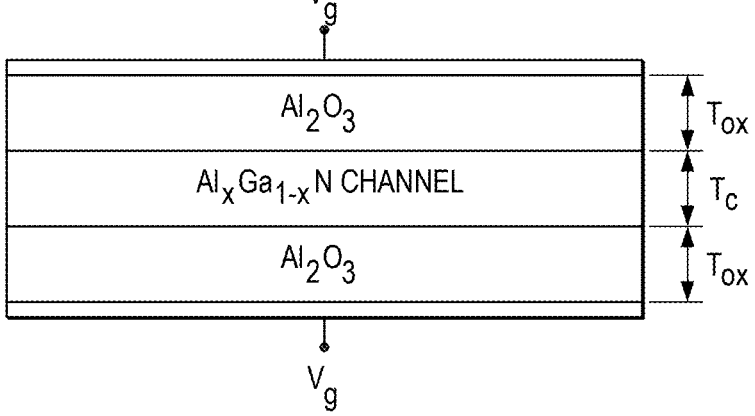
FIG. 5A is schematic of an exemplary nanosheet metal-oxide-semiconductor field-effect transistor (MOSFET) evaluated using computational analysis.
Figure 5B:
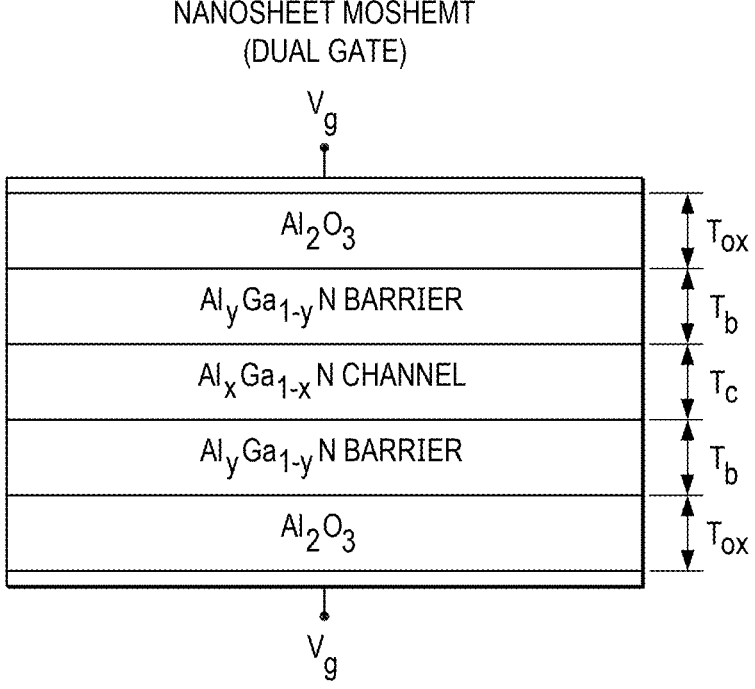
FIG. 5B is a schematic of an exemplary nanosheet MOSHEMT evaluated using computational analysis.

In order to translate the material benefits of AlGaN into high-frequency electronics, new device architectures with intrinsically high current carrying capability are desired. The physics of operation and the benchmarking of dual-gate nanosheet heterostructures with Al-rich AlGaN as the channel material are presented. The focus is both nanosheet MOSFET (FIG. 5A) and MOSHEMT (FIG. 5B) architectures because of their differing tradeoffs with respect to carrier confinement, gate modulation of carrier density, and performance metrics. The nanosheet heterostructures can be stacked in parallel in a 3D manner between the source and drain contacts to enhance the maximum on-current and the output power delivered by the device. Moreover, the precise control of the alloy composition and the dimensions of each nanosheet heterostructure in the stack may alleviate the impact of parasitics and enable higher RF linearity above 90 GHz. By combining electrostatics simulations with a virtual-source (VS)-based transport model, it is demonstrated that the 3D AlGaN nanosheet heterostructure transistors are capable of delivering >5 mA/μm output current and >5 W/mm power density per nanosheet at a cutoff frequency of >150 GHz.

Figure 6A:
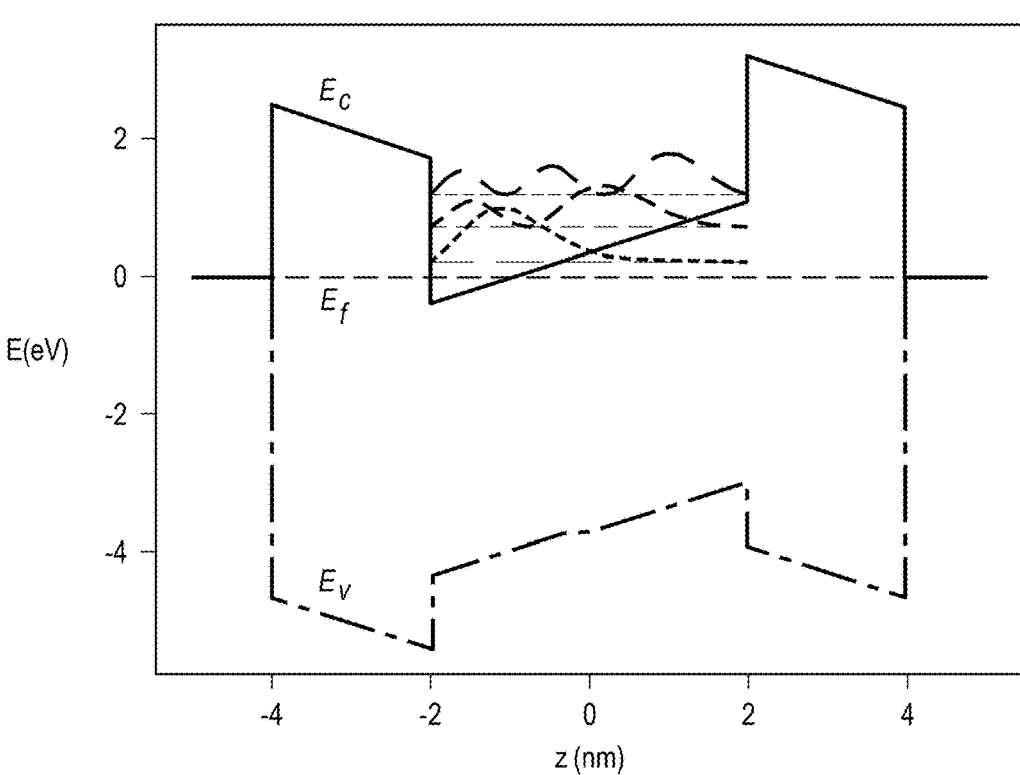
FIGS. 6A-6D show results from the computational analysis for the AlGaN nanosheet MOSFET of FIG. 5A.
Figure 7A:
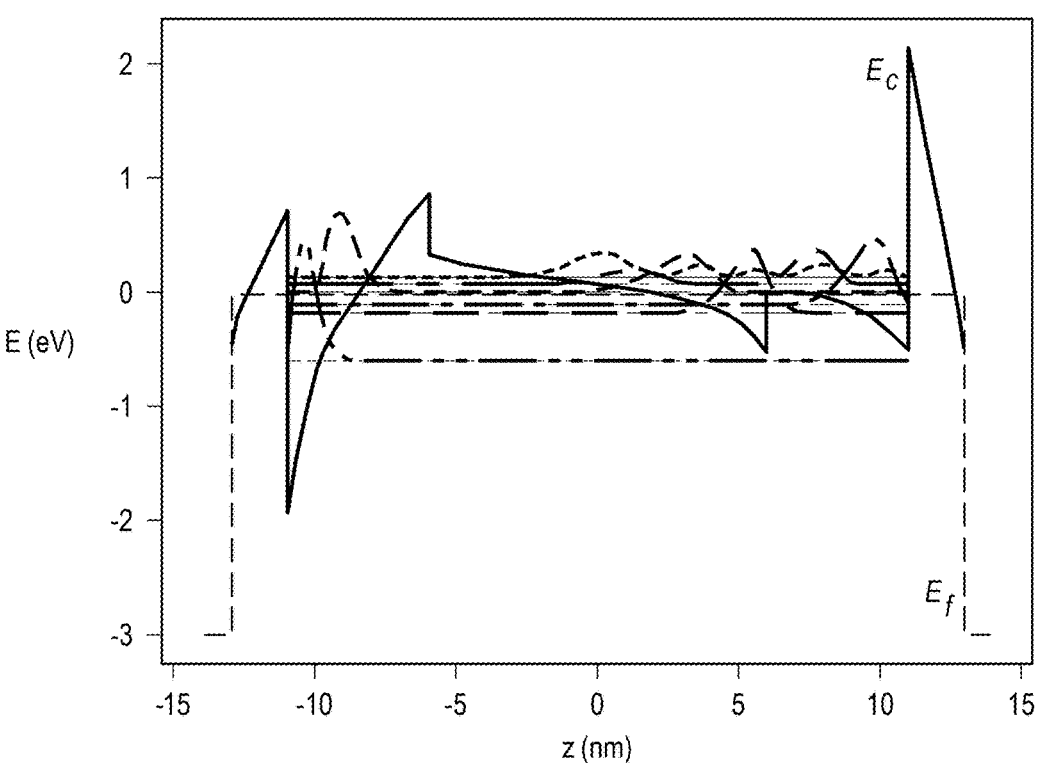
FIG. 7A-7D show results from the computational analysis for the AlGaN nanosheet MOSHEMT of FIG. 5B.

To obtain the gate bias dependence of the 2DEG in the channel, the 1D Schrodinger-Poisson (ScP) equation is solved in the quantum region defined by the channel for the MOSFET and the channel plus barrier for the MOSHEMT. The polarization charge at various interfaces is modeled based on the alloy composition and the thickness of various epitaxial layers. The Schottky barrier height between $Al_2O_3$ oxide and AlGaN is assumed to be 2.4 eV. Eight sub-bands are considered in the channel for gate voltages ($V_g$) up to 3 V, although in FIGS. 6A and 7A, only a few are shown for ease of readability.

Figure 6B:
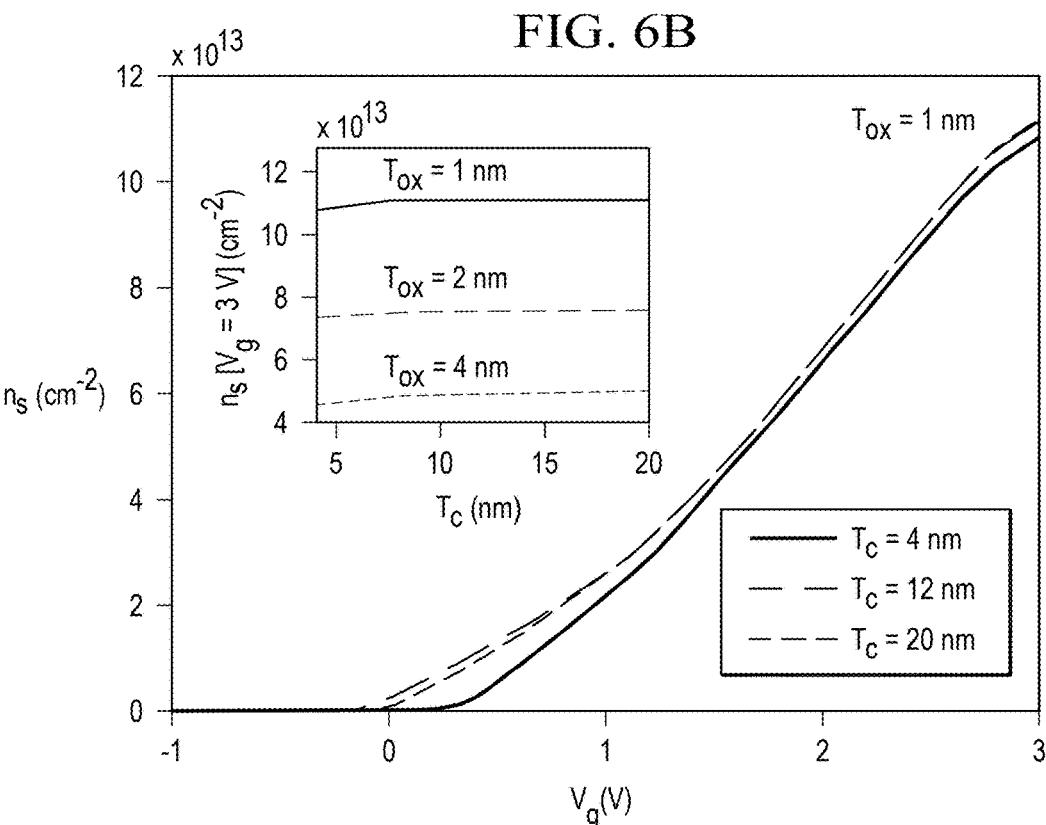
Figure 6C:
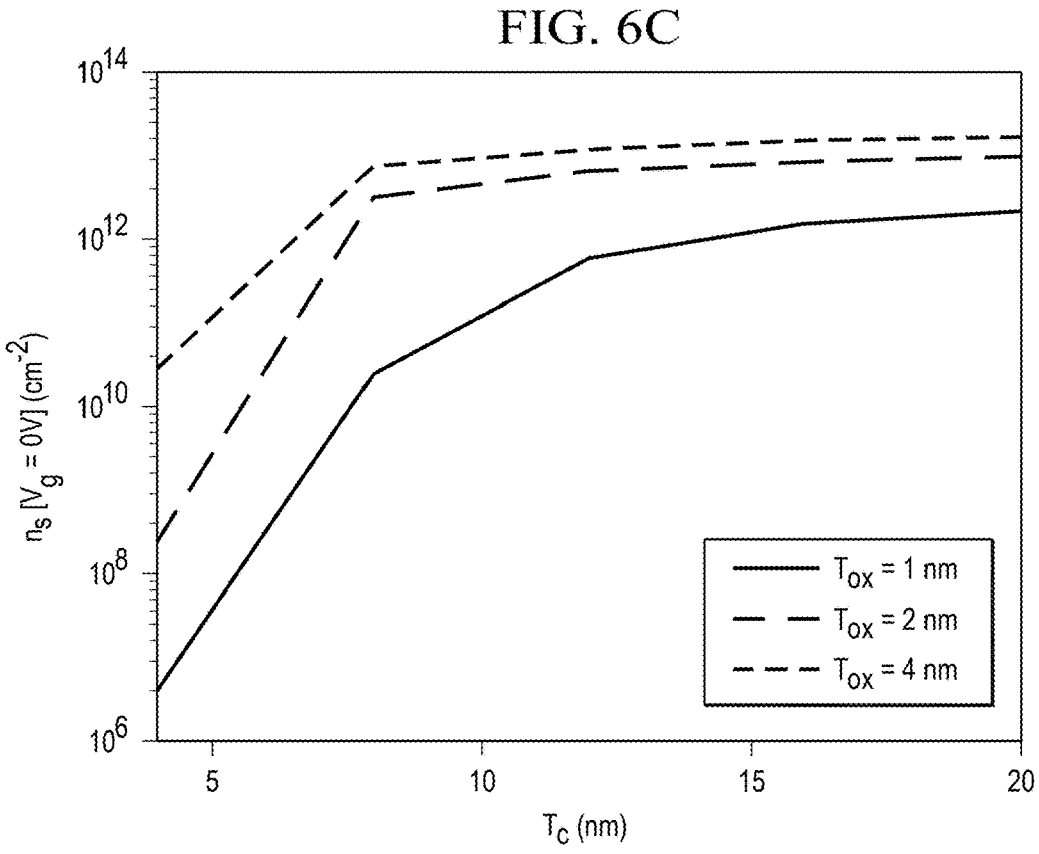
Figure 6D:
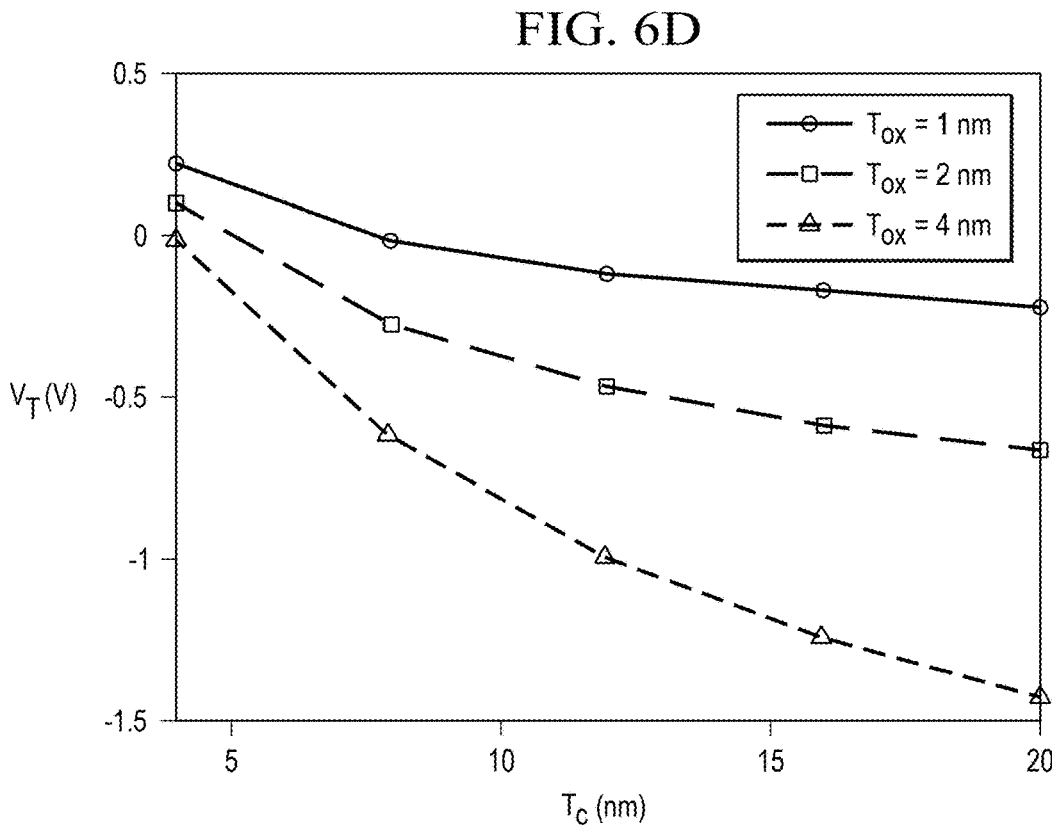

AlGaN MOSFET: In equilibrium with $V_g=0$ V, the 2DEG density ($n_s$) increases as the thickness of the AlGaN channel ($T_c$) increases due to the lowering of the sub-band energy, as shown in FIG. 6B. Due to the superior gate control of the 2DEG with lower oxide thickness ($T_{ox}$), the threshold voltage ($V_t$) of the device is higher, as shown in FIG. 6D; hence $n_s$ at $V_g=0$ V is lower for lower $T_{ox}$ values at a fixed $T_c$ value. In the on-state, the 3D AlGaN MOSFET with 1 nm $T_{ox}$ can support as high as $10^{14}$ cm$^{-2}$ 2DEG density with $T_c=4$ nm, as shown in FIG. 6C. The 3D AlGaN MOSFET can also exhibit enhancement mode operation (i.e., $V_t>0$) for $T_c \leq 8$ nm ($\leq 4$ nm) for $T_{ox}=1$ nm (2 nm), as can be seen from FIG.

6D. However, as $T_{ox}$ increases for a fixed $T_c$, the gate control diminishes and the AlGaN MOSFET becomes normally-on (i.e., $V_t<0$ for $T_{ox} \geq 4$ nm and $T_c \geq 4$ nm).

Figure 7B:
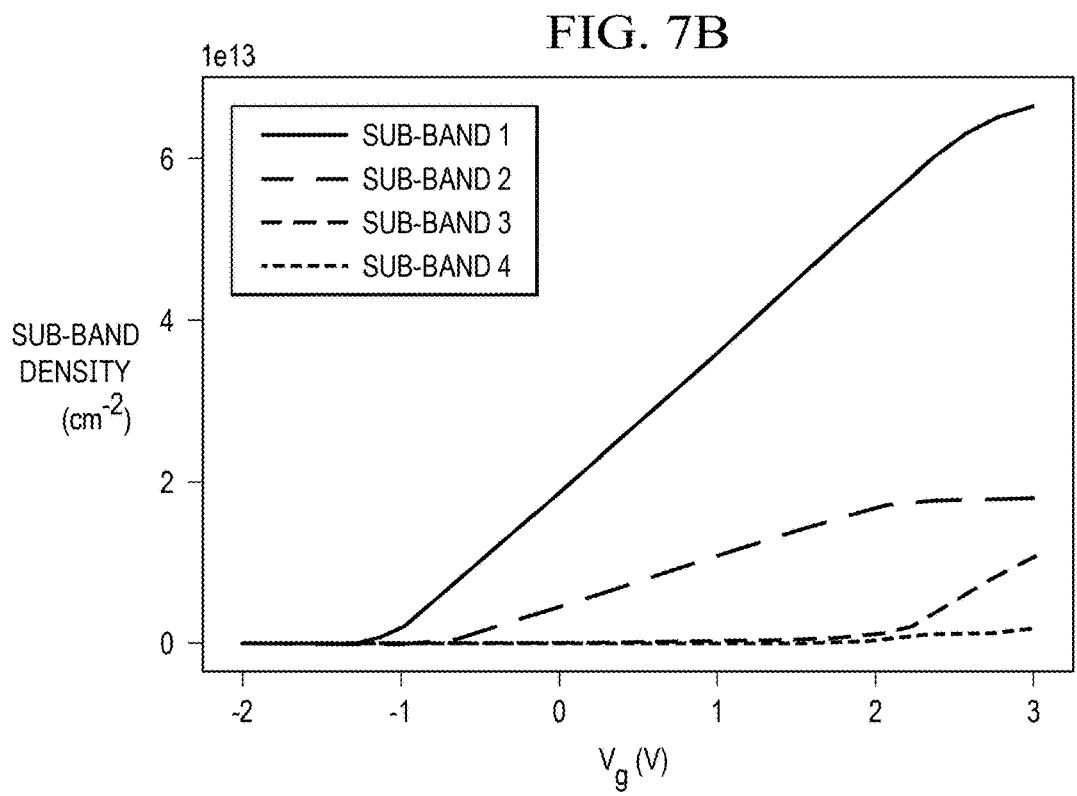
Figure 7C:
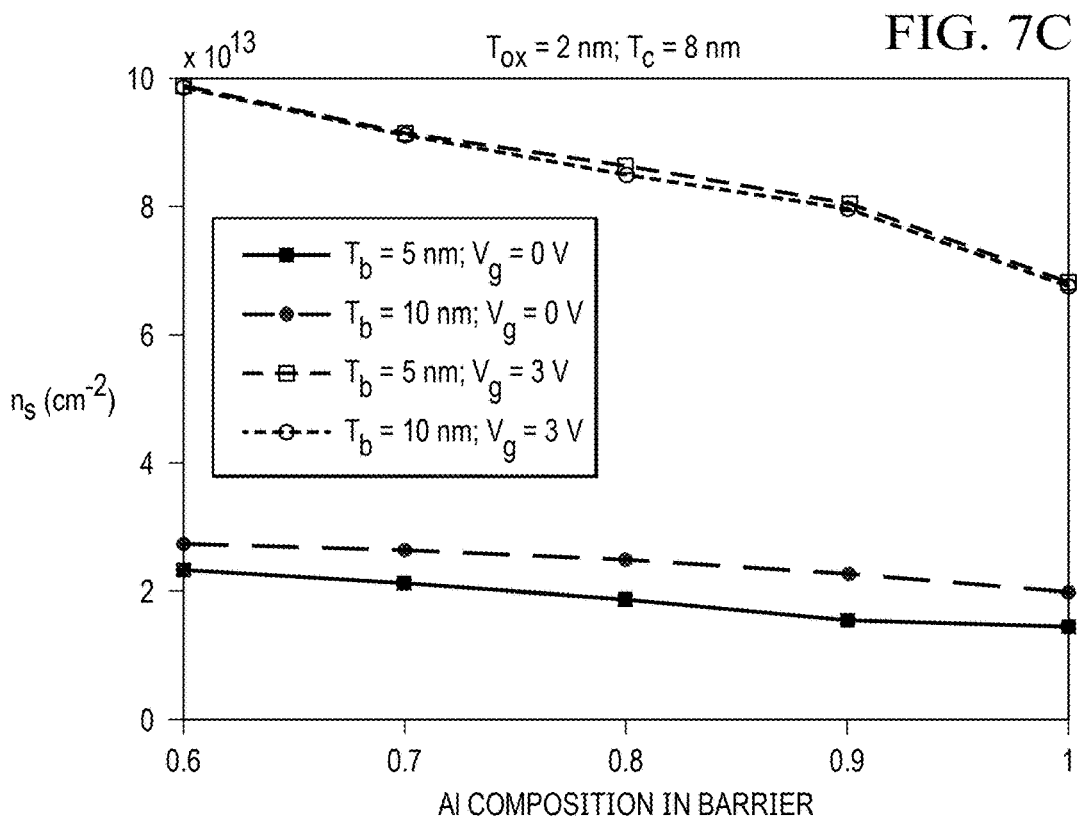

AlGaN MOSHEMT: In the case of MOSHEMT with $Al_{0.6}Ga_{0.7}N$ barrier surrounding $Al_{0.3}Ga_{0.7}N$ channel, there is significant carrier density in the top barrier due to the formation of a quantum well at the oxide-barrier interface (the sub-band1 in FIGS. 7A and 7B), and the application of the gate bias increases the net carrier density. However, as the alloy composition increases, the carrier density at the same $V_g$ and $T_b$ values decreases due to the higher band discontinuity. Referring to FIG. 7C, a larger value of $T_b$ leads to a slight increase in the 2DEG density at the same $V_g$ value and alloy composition.

Figure 7D:
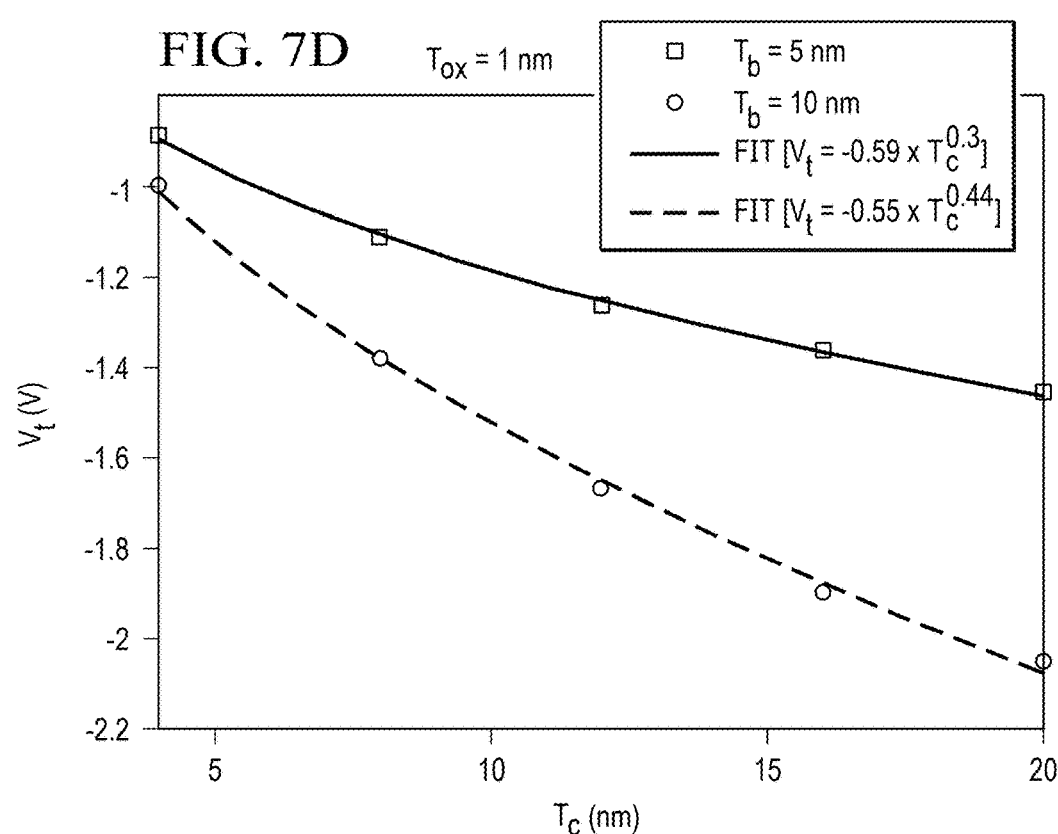
Figure 8A:
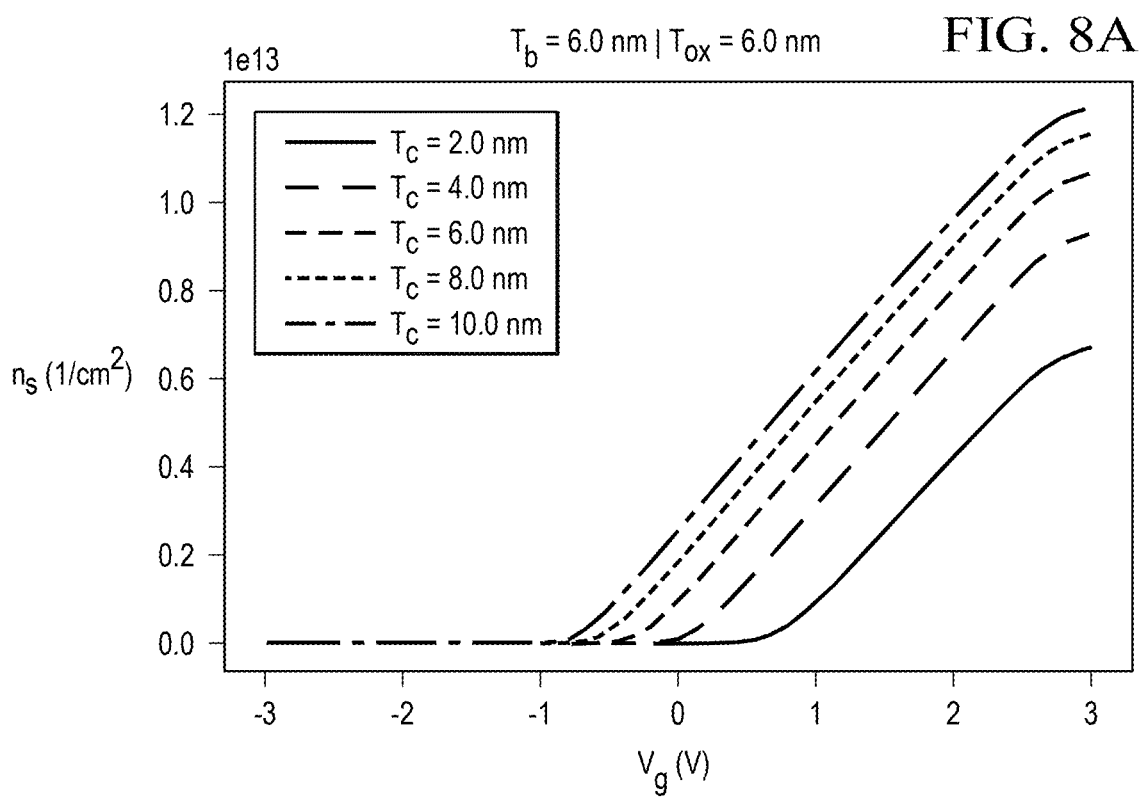
FIGS. 8A and 8B plot additional computational data for an AlGaN nanosheet MOSHEMT including channel charge density ($n_s$) versus gate voltage ($V_g$) and threshold voltage ($V_{th}$) versus channel thickness ($T_c$).
Figure 8B:
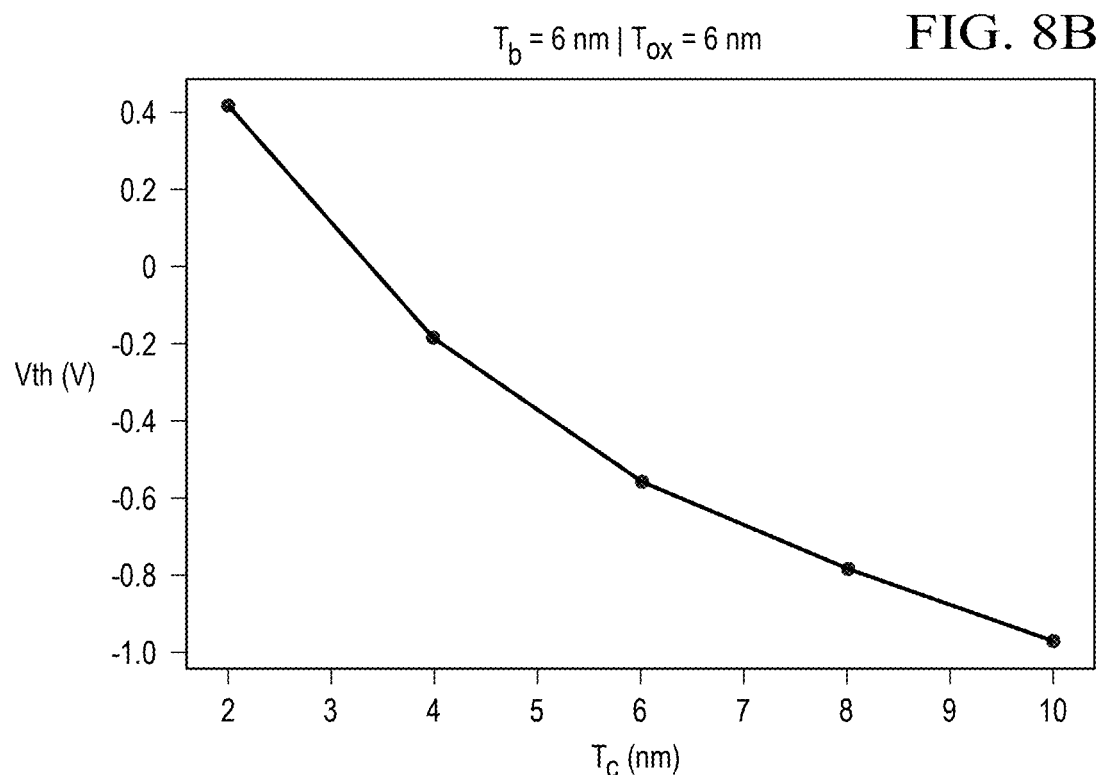

However, due to a higher $T_b$, the electrostatic control of the gate is diminished, which leads to higher short-channel effects in MOSHEMTs compared to MOSFETs. Due to the higher 2DEG density at $V_g=0$ V, the MOSHEMT is a normally-on device ($V_t<0$) even for channels as thin as 4 nm, as shown in FIG. 7D A compact transport model based on carrier injection at the VS is developed. According to this model, the drain-source current is given as the product of the channel charge ($n_s$) and the effective injection velocity ($v_{eff}$) of charges at the VS point. $v_{eff}$ is proportional to the unidirectional thermal velocity ($v_T$) and the ballisticity parameter (B), which is higher in the saturation regime than in the linear regime due to a smaller value of the critical backscattering length ($L_{crit}$) in saturation. The transport model is coupled to the ScP simulations of the 2DEG described previously to reduce empiricism and thus obtain an accurate estimate of device performance. For $Al_{0.3}Ga_{0.7}N$ device of 50-nm gate length with electron mean free path $\lambda=14$ nm, $L_{crit}=0.1$ $L_g$, B=0.53, and $v_{eff}=5.88 \times 10^6$ cm/s. Assuming a parasitic factor of 0.5 (device non-idealized), obtained are a maximum on-current IDSAT>5 mA/μm and output power density>5 W/mm per nanosheet for both MOSFETs and MOSHEMTs in the saturation regime, as summarized in Table 2. It is found that, by appropriately tuning the Al composition and dimensions of the individual nanosheet heterostructures in the 3D stack, the proposed devices can deliver higher RF performance than GaN devices.

charge density or carrier density may be on the order of $10^{13}$ cm$^{-2}$ in the on-state of the transistor, and FIG. 8B shows that the threshold voltage remains positive for channel thickness<4 nm and for barrier thickness ($T_b$) and oxide thickness ($T_{ox}$) equal to 6 nm.

Figure 9:
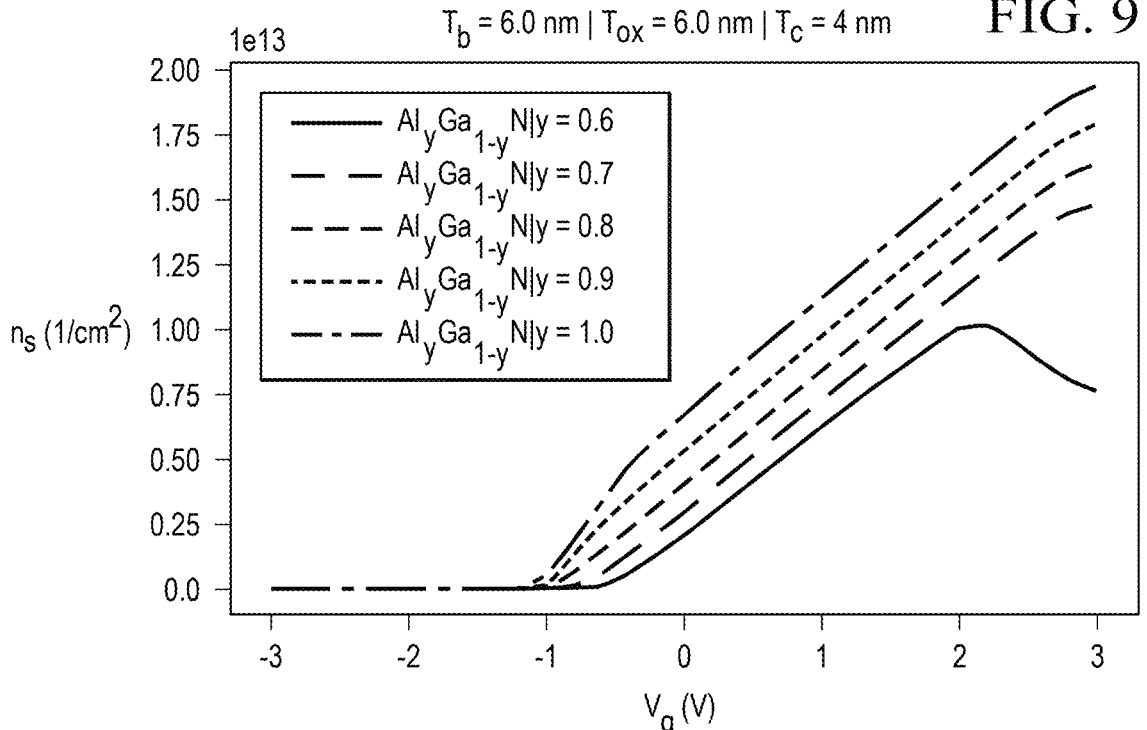
FIG. 9 shows the impact of alloy composition of the barrier layer on the channel charge density and its gate modulation for an AlGaN nanosheet MOSHEMT.

FIG. 9 shows the impact of alloy composition of the barrier layer on the channel charge density and its gate modulation of an exemplary AlGaN MOSHEMT. At a fixed gate voltage, the channel charge density and therefore the current in the nanostack transistor can be increased by increasing the alloy composition of the barrier. For y=0.6, the charge density decreases at high gate bias ($V_g$) (>2 V) in the on-state of the nanosheet because of a parasitic channel formed in the barrier layer. This is mitigated by increasing the barrier's alloy composition, which increases the overall carrier density in the channel and is beneficial for device operation.

Figure 10A:
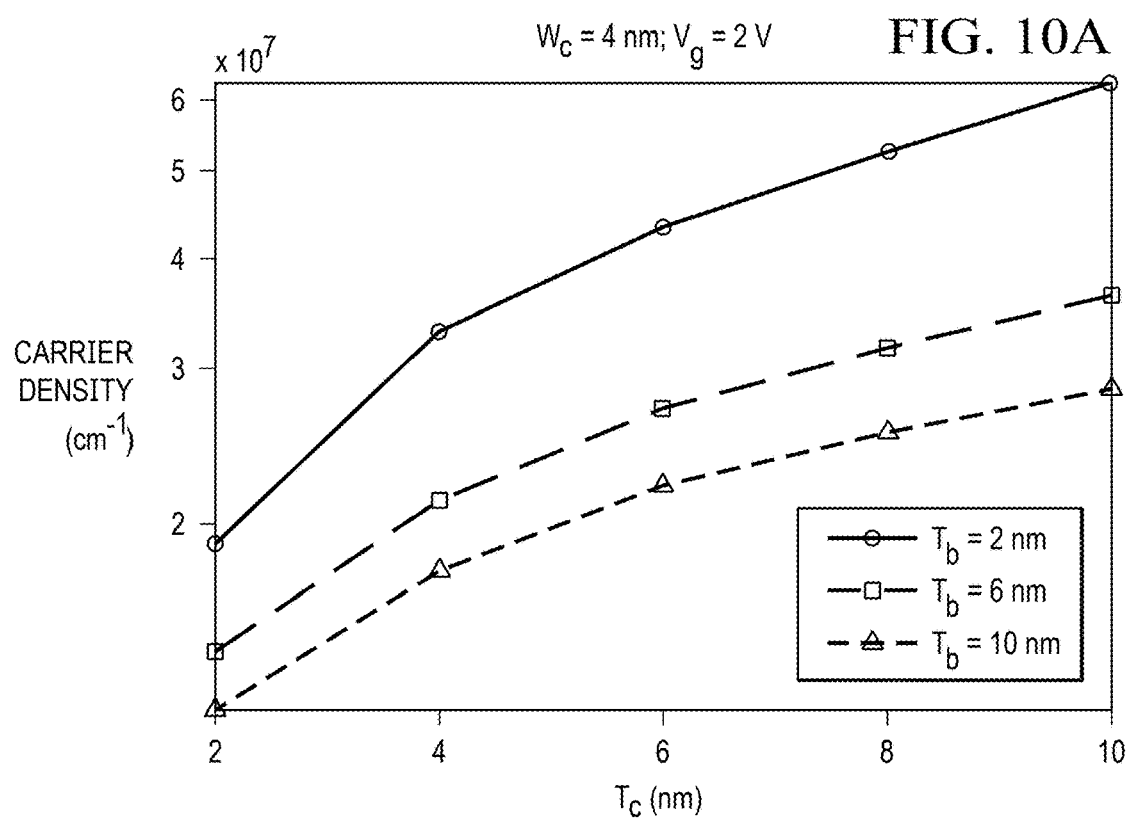
FIGS. 10A and 10B show results of computational analysis for a single nanowire AlGaN MOSHEMT having a gate-all-around configuration as shown in FIG. 2A.
Figure 10B:
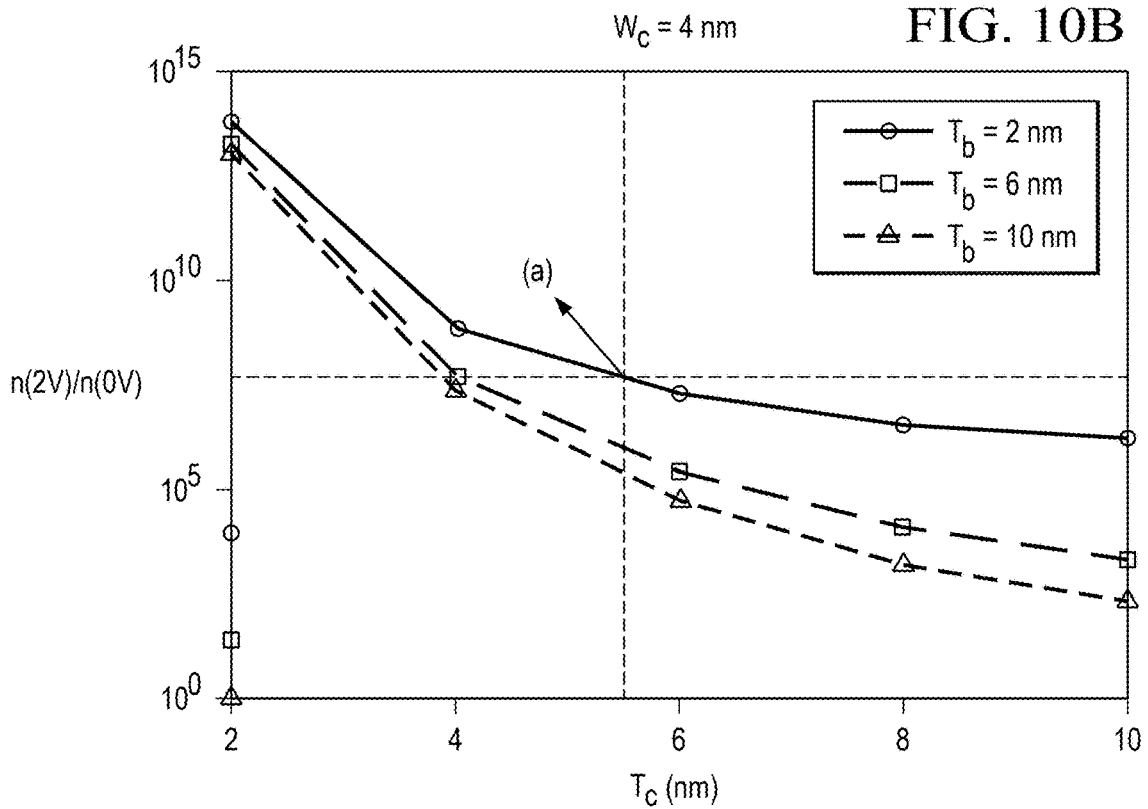

FIGS. 10A and 10B show results of computational analysis for a single nanowire AlGaN MOSHEMT having a gate-all-around configuration as illustrated in FIG. 2A. FIG. 10A shows the carrier density at a gate voltage of 2 V versus the thickness of the nanowire for various values of the barrier thickness, while the width of the nanowire is 4 nm. FIG. 10B shows modulation of the channel charge by gate voltage as a function of the channel thickness. The charge modulation is given as the ratio of charge at gate voltage=2 V and gate voltage=0 V.

The above-described modeling-based analysis shows the following benefits of the nanowire and nanosheet heterostructure-based devices:

(1) Aluminum-rich AlGaN UWBG channel layers in nanowire or nanosheet heterostructure stacks can support electron density on the order of $10^{13}$-$10^{14}$ cm$^{-2}$ when the transistor is in the on-state (e.g., gate voltage=3 V). This electron density is higher than the electron density supported in existing GaN HEMTs. The higher electron density in the channel is a prerequisite for achieving higher frequency and higher output power from the transistor.

(2) With increasing aluminum composition in the barrier layer of the 3D MOS-HEMT structure, the channel charge density for a given gate voltage can be

TABLE 2

| Characteristics and Performance Results of MOSFET and MOSHEMT in Computational Analysis | | |
|---|---|---|
| $L_g = 50$ nm $V_g = 3$ V, $V_d - V_{knee} = 5$ V | MOSFET | MOSHEMT |
| Dimensions | Channel thickness = 4 nm; Dielectric thickness = 1 nm | Channel thickness = 4 nm; Barrier thickness = 5 nm; Dielectric thickness = 1 nm |
| Alloy composition | Channel = 30% Al | Channel = 30% Al Barrier = 60% Al |
| Threshold voltage | 0.21 V | −0.9 V |
| Carrier density in on-state | $1.07 \times 10^{14}$ cm$^{-2}$ | $1.47 \times 10^{14}$ cm$^{-2}$ |
| Max. on current | 5539 μA/μm per nanosheet ($P_f = 0.5$) | 7709 μA/μm per nanosheet ($P_f = 0.5$) |
| Cut-off frequency | 154 GHz | 154 GHz |
| Max. output power | 5.6 W/mm per nanosheet | 7.69 W/mm per nanosheet |

Some additional computational data for a single nanosheet AlGaN MOSHEMT including channel charge density ($n_s$) versus gate voltage ($V_g$) and threshold voltage ($V_{th}$) versus channel thickness ($T_c$) are shown in FIGS. 8A and 8B. Referring to FIG. 8A, it can be seen that the channel enhanced, thus allowing for further improvements in the RF performance of the nanowire or nanosheet heterostructure stacks.

(3) The threshold voltage of the 3D nanostack transistor may be positive, unlike existing GaN HEMTs, which have a negative threshold voltage. The positive threshold voltage of the transistor is important for higher efficiency in RF electronic circuits.

(4) The 3D stacks of nanowire or nanosheet heterostructures permit higher gate control of the channel layer. This means that the gate electrode can efficiently modulate the on-off characteristics of the channel layer. Good gate control is required to overcome the short-channel effects in transistors as the transistor length is made shorter for achieving higher frequency of operation and higher output power. In the above examples with Al-rich AlGaN channel layers, the on-off carrier density can be modulated by more than 10 orders of magnitude as gate voltage changes from a negative value of −0.4 V to a positive value of 3 V.

(5) Due to the precise control of the alloy composition and the geometry of the individual nanowire or nanosheet heterostructures within the stack(s), this 3D transistor architecture provides greater flexibility and control over the performance metrics. That is, this device architecture can simultaneously achieve >80 watt per millimeter output power density (more than 10 times higher than that achieved in existing GaN HEMTs) and a cut-off frequency greater than 120 GHz.

Computational studies provide the following projected performance metrics for a nanowire or nanosheet heterostructure thickness of about 10 nm or less, an oxide thickness of 2-4 nm, and a gate length of 80 nm or less: a 3D MOSFET and MOSHEMT with more than 50 parallel nanosheets may be able to deliver 80 Watts per millimeter output power while operating at a frequency above 90 GHz, and similar performance may be achieved using nanowire 3D MOSFETs of cross-sectional area $(10 \times 10)$ nm$^2$ and more than 50 parallel nanowires.

The subject-matter of the disclosure may also relate to the following aspects:

A first aspect relates to a high electron mobility transistor (HEMT) for high frequency applications, the HEMT comprising: a source and a drain spaced apart on a substrate, each of the source and drain extending vertically away from the substrate; a stack of nanowire or nanosheet heterostructures suspended between the source and the drain, the nanowire or nanosheet heterostructures being vertically separated from each other, each of the nanowire or nanosheet heterostructures comprising a channel layer between top and bottom barrier layers; a gate dielectric layer on each nanowire or nanosheet heterostructure; and a gate electrode on each gate dielectric layer, wherein each of the channel layers comprises a first group III nitride including aluminum, and wherein each of the top and bottom barrier layers comprises a second group III nitride including a higher amount of aluminum than the first group III nitride, and wherein the stack includes N of the nanowire or nanosheet heterostructures, N being an integer from 2 to 50.

A second aspect relates to the HEMT of the first aspect, wherein the first group III nitride and the second group III nitride comprise aluminum nitride, aluminum scandium nitride, aluminum indium scandium nitride, aluminum boron nitride, aluminum boron gallium nitride, aluminum boron scandium nitride, aluminum gallium nitride, and/or aluminum scandium gallium nitride.

A third aspect relates to the HEMT of the first or second aspect, wherein the channel layers of the nanowire or nanosheet heterostructures collectively comprise at least two different compositions of the first group III nitride.

A fourth aspect relates to the HEMT of any preceding aspect, wherein the channel layers of the nanowire or nanosheet heterostructures collectively comprise up to N different compositions of the first group III nitride.

A fifth aspect relates to the HEMT of any preceding aspect, wherein the first group III nitride comprises $Al_xGa_{1-x}N$, wherein $x \geq 0.3$.

A sixth aspect relates to the HEMT of the fifth aspect, wherein $0.3 \leq x \leq 0.5$.

A seventh aspect relates to the HEMT of the fifth or sixth aspect, wherein the channel layers of the nanowire or nanosheet heterostructures collectively comprise at least two different values of x.

An eighth aspect relates to the HEMT of any of the fifth through seventh aspects, wherein the channel layers of the nanowire or nanosheet heterostructures collectively comprise up to N different values of x.

A ninth aspect relates to the HEMT of any preceding aspect, wherein the channel layers of the nanowire or nanosheet heterostructures collectively comprise at least two different thicknesses.

A tenth aspect relates to the HEMT of any preceding aspect, wherein the channel layers of the nanowire or nanosheet heterostructures collectively comprise up to N different thicknesses.

An eleventh aspect relates to the HEMT of any preceding aspect, wherein each of the channel layers has a thickness in a range from about 4 nm to about 20 nm.

A twelfth aspect relates to the HEMT of any preceding aspect, wherein the top and bottom barrier layers of the nanowire or nanosheet heterostructures collectively comprise at least two different compositions of the second group III nitride.

A thirteenth aspect relates to the HEMT of any preceding aspect, wherein the top and bottom barrier layers of the nanowire or nanosheet heterostructures collectively comprise up to N different compositions of the second group III nitride.

A fourteenth aspect relates to the HEMT of any preceding aspect, wherein the second group III nitride comprises $Al_yR_zGa_{1-y-z}N$, wherein $0.6 \leq y \leq 1.0$, $0 \leq z \leq 0.4$, and R is selected from the group consisting of: B and Sc.

A fifteenth aspect relates to the HEMT of the fourteenth aspect, wherein $0.6 \leq y \leq 0.9$.

A sixteenth aspect relates to the HEMT of the fourteenth or fifteenth aspect, wherein the top and bottom barrier layers of the nanowire or nanosheet heterostructures collectively comprise at least two different values of y and/or at least two different values of z.

A seventeenth aspect relates to the HEMT of the fourteenth through the fifteenth aspects, wherein the top and bottom barrier layers of the nanowire or nanosheet heterostructures collectively comprise up to N different values of y and/or up to N different values of z.

An eighteenth aspect relates to the HEMT of any preceding aspect, wherein the top and bottom barrier layers of the nanowire or nanosheet heterostructures collectively comprise at least two different thicknesses.

A nineteenth aspect relates to the HEMT of any preceding aspect, wherein the top and bottom barrier layers of the nanowire or nanosheet heterostructures collectively comprise up to N different thicknesses.

A twentieth aspect relates to the HEMT of any preceding aspect, wherein each of the top and bottom barrier layers has a thickness in a range from about 4 nm to about 20 nm.

A twenty-first aspect relates to the HEMT of any preceding aspect, where the nanowire or nanosheet heterostructures are undoped.

A twenty-second aspect relates to the HEMT of any preceding aspect, wherein the stack of nanowire or nanosheet heterostructures is a stack of nanowire heterostructures.

A twenty-third aspect relates to the HEMT of the twenty-second aspect, wherein the gate electrode surrounds each of the nanowire heterostructures, the gate electrode having a gate-all-around configuration.

A twenty-fourth aspect relates to the HEMT of the twenty-second or twenty-third aspect, wherein the stack of nanowire heterostructures is a first stack, and further comprising a second stack of nanowire heterostructures laterally spaced apart from the first stack and suspended between the source and the drain, the nanowire heterostructures of the second stack being vertically separated from each other.

A twenty-fifth aspect relates to the HEMT of any preceding aspect, wherein the stack of nanowire or nanosheet heterostructures is a stack of nanosheet heterostructures.

A twenty-sixth aspect relates to the HEMT of the twenty-fifth aspect, wherein the gate electrode comprises a top gate overlying each nanosheet heterostructure and a bottom gate underlying each nanosheet heterostructure, the top and bottom gates having a dual gate configuration.

A twenty-seventh aspect relates to the HEMT of any preceding aspect, wherein the dielectric layer has a thickness in a range from about 2 nm to about 10 nm, wherein the dielectric layer comprises $Al_2O_3$ and/or $HfZrO_2$, and/or wherein a length of the gate electrode is in a range from about 30 nm to about 70 nm.

A twenty-eighth aspect relates to the HEMT of any preceding aspect, wherein the substrate comprises GaN.

A twenty-ninth aspect relates to the HEMT of any preceding aspect, wherein the source and the drain comprise $In_xGa_{1-x}N$, wherein $0 \leq x \leq 0.5$, the source and the drain having a graded composition where x increases in a direction away from the substrate.

A thirtieth aspect relates to the HEMT of the twenty-ninth aspect, wherein the $In_xGa_{1-x}N$ comprises Si, Te, and/or Se as a dopant.

A thirty-first aspect relates to the HEMT of the twenty-ninth or thirtieth aspect, wherein the $In_xGa_{1-x}N$ is heavily doped, the $In_xGa_{1-x}N$ comprising a dopant at a concentration of at least about $1 \times 10^{18}/cm^3$.

A thirty-second aspect relates to the HEMT of any preceding aspect, wherein the nanowire or nanosheet heterostructures are vertically separated from each other by a distance in a range from about 10 nm to about 100 nm.

A thirty-third aspect relates to the HEMT of any preceding aspect, wherein each nanowire or nanosheet heterostructure comprises a 2D electron gas (2DEG).

A thirty-fourth aspect relates to the HEMT of any preceding aspect comprising a cut-off frequency of at least about 25 GHz, at least about 65 GHz, at least about 105 GHz, or at least about 145 GHz.

A thirty-fifth aspect relates to the HEMT of any preceding aspect having a maximum output power of at least about 300 mW/mm, at least about 700 mW/mm, at least about 1 W/mm, or at least about 1.5 W/mm per nanowire or nanosheet heterostructure.

A thirty-sixth aspect relates to the HEMT of the thirty-fifth aspect having a total maximum output power of N times the maximum output power.

A thirty-seventh aspect relates to the HEMT of any preceding aspect exhibiting high linearity, wherein, e.g., over a gate bias ($V_{gs}$) range of at least about 300 mV, a transconductance ($g_m$) of the HEMT decreases less than about 10% from a maximum transconductance ($g_{m,max}$).

A thirty-eighth aspect relates to a power amplifier for use at frequencies above 90 GHz, the power amplifier comprising the HEMT of any preceding aspect.

A thirty-ninth aspect relates to a method of making a HEMT, the method comprising: epitaxially growing a stack of layers on a substrate, the stack of layers including N sacrificial layers comprising a sacrificial material alternating with N heterostructure layers, each of the heterostructure layers comprising a first group III nitride and a second group III nitride, where N is an integer and $2 \leq N \leq 50$; forming a source and a drain on the substrate alongside the stack of layers on a first side and a second side thereof, respectively, the stack of layers connecting the source and the drain; removing the sacrificial layers comprising the sacrificial material so as to isolate the heterostructure layers, thereby forming a stack of nanosheet heterostructures suspended between the source and the drain and being vertically separated from each other; forming a gate dielectric layer on each of the nanosheet heterostructures; and forming a gate electrode on the gate dielectric layer.

A fortieth aspect relates to the method of the thirty-ninth aspect, wherein each of the nanosheet heterostructures comprises a channel layer between top and bottom barrier layers, the channel layer comprising the first group III nitride and the top and bottom barrier layers comprising the second group III nitride.

A forty-first aspect relates to the method of the thirty-ninth or fortieth aspect, wherein epitaxially growing the stack of layers comprises chemical vapor deposition or molecular beam epitaxy.

A forty-second aspect relates to the method of any of the thirty-ninth through the forty-first aspects, wherein forming the source and the drain comprises regrowth after lithography and etching of the stack of layers.

A forty-third aspect relates to the method of any of the thirty-ninth through the forty-second aspects, wherein removing the sacrificial nanowires comprises metal assisted chemical etching, photoelectrochemical etching, and/or reactive ion etching.

A forty-fourth aspect relates to the method of any of the thirty-ninth through the forty-third aspects, wherein forming the gate dielectric layer comprises atomic layer deposition.

A forty-fifth aspect relates to the method of any of the thirty-ninth through the forty-fourth aspects, wherein the gate electrode is formed in a dual gate configuration.

A forty-sixth aspect relates to the method of any of the thirty-ninth through the forty-fifth aspects, wherein the HEMT, the nanosheet heterostructures, the channel layer, the top and bottom barrier layers, the first group III nitride, and the second group III nitride have any of the features recited in any of the first through the thirty-eighth aspects.

A forty-seventh aspect relates to a method of making a HEMT, the method comprising: epitaxially growing a stack of layers on a substrate, the stack of layers including N sacrificial layers comprising a sacrificial material alternating with N heterostructure layers, each of the heterostructure layers comprising a first group III nitride and a second group III nitride, where N is an integer and $2 \leq N \leq 50$; forming a source and a drain on the substrate alongside the stack of layers on a first side and a second side thereof, respectively, the stack of layers connecting the source and the drain; removing material from a third side and a fourth side of the stack of layers to define a stack of wires of a predetermined width connecting the source and the drain, the stack of wires comprising sacrificial nanowires of the sacrificial material alternating with heterostructure nanowires comprising the first group III nitride and the second group III nitride; and removing the sacrificial nanowires comprising the sacrificial material so as to isolate the heterostructure nanowires, thereby forming a stack of nanowire heterostructures suspended between the source and the drain and being vertically separated from each other; forming a gate dielectric layer on each of the nanowire heterostructures; and forming a gate electrode on the gate dielectric layer.

A forty-eighth aspect relates to the method of the forty-seventh aspect, wherein each of the nanowire heterostructures comprises a channel layer between top and bottom barrier layers, the channel layer comprising the first group III nitride and the top and bottom barrier layers comprising the second group III nitride.

A forty-ninth aspect relates to the method of any of the forty-seventh or the forty-eighth aspect, wherein epitaxially growing the stack of layers comprises chemical vapor deposition or molecular beam epitaxy.

A fiftieth aspect relates to the method of the forty-seventh through the forty-ninth aspects, wherein forming the source and the drain comprises regrowth after lithography and etching of the stack of layers.

A fifty-first aspect relates to the method of the forty-seventh through the fiftieth aspects, wherein removing the material from the third and fourth sides of the stack comprises wet etching and/or metal-assisted chemical etching.

A fifty-second aspect relates to the method of any of the forty-seventh through the fifty-first aspects, wherein removing the sacrificial nanowires comprises metal assisted chemical etching, photoelectrochemical etching, and/or reactive ion etching.

A fifty-third aspect relates to the method of any of the forty-seventh through the fifty-second aspects, wherein forming the gate dielectric layer comprises atomic layer deposition.

A fifty-fourth aspect relates to the method of any of the forty-seventh through the fifty-third aspects, wherein the gate electrode is formed in a gate-all-around configuration.

A fifty-fifth aspect relates to the method of any of the forty-seventh through the fifty-fourth aspects, wherein the HEMT, the nanosheet heterostructures, the channel layer, the top and bottom barrier layers, the first group III nitride, and the second group III nitride have any of the features recited in any of the first through the thirty-eighth aspects.

A fifty-sixth aspect relates to a heterostructure stack for an electronic device, the heterostructure stack comprising: first and second electrodes spaced apart on a substrate, each of the first and second electrodes extending vertically away from the substrate; and a stack of nanowire or nanosheet heterostructures suspended between the first and second electrodes, the nanowire or nanosheet heterostructures being vertically separated from each other, wherein each of the nanowire or nanosheet heterostructures comprises at least a first wide bandgap semiconductor and a second wide bandgap semiconductor, and wherein the stack includes N of the nanowire or nanosheet heterostructures, N being an integer from 2 to 50.

A fifty-seventh aspect relates to the heterostructure stack of the fifty-sixth aspect, wherein the electronic device is selected from the group consisting of a field effect transistor, a high electron mobility transistor, a bipolar junction transistor, a light emitting diode, a laser, and/or a solar cell.

A fifty-eighth aspect relates to the heterostructure stack of the fifty-sixth or fifty-seventh aspect, wherein the first and second wide bandgap semiconductors are selected from the group consisting of: aluminum antimonide, aluminum arsenide, aluminum gallium arsenide, aluminum gallium indium phosphide, aluminum gallium nitride, aluminum gallium phosphide, aluminum indium arsenide, aluminum nitride, aluminum scandium nitride, aluminum indium scandium nitride, aluminum boron nitride, aluminum boron gallium nitride, aluminum boron scandium nitride, aluminum gallium nitride, aluminum scandium gallium nitride, aluminum phosphide, boron arsenide, boron nitride, boron phosphide, gallium antimonide, gallium arsenide, gallium arsenide phosphide, gallium indium arsenide antimonide phosphide, gallium nitride, gallium phosphide, indium aluminum nitride, indium antimonide, indium arsenide, indium arsenide antimonide phosphide, indium gallium arsenide, indium gallium arsenide phosphide, indium gallium nitride, indium gallium phosphide, indium nitride, and indium phosphide.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A high electron mobility transistor (HEMT) for high frequency applications, the HEMT comprising:
a source and a drain spaced apart on a substrate, each of the source and drain extending vertically away from the substrate;
a stack of nanowire or nanosheet heterostructures suspended between the source and the drain, the nanowire or nanosheet heterostructures being vertically separated from each other in an air-bridge formation, each of the nanowire or nanosheet heterostructures comprising a channel layer between top and bottom barrier layers;

a gate dielectric layer on each nanowire or nanosheet heterostructure; and a gate electrode on each gate dielectric layer, wherein each of the channel layers comprises a first group III nitride including aluminum, and wherein each of the top and bottom barrier layers comprises a second group III nitride including a higher amount of aluminum than the first group III nitride, and wherein the stack includes N of the nanowire or nanosheet heterostructures, N being an integer from 2 to 50.

2. The HEMT of claim 1, wherein the first group III nitride and the second group III nitride comprise aluminum nitride, aluminum scandium nitride, aluminum indium scandium nitride, aluminum boron nitride, aluminum boron gallium nitride, aluminum boron scandium nitride, aluminum gallium nitride, and/or aluminum scandium gallium nitride.

3. The HEMT of claim 1, wherein the first group III nitride comprises $Al_xGa_{1-x}N$, wherein $x \geq 0.3$.

4. The HEMT of 3, wherein the channel layers of the nanowire or nanosheet heterostructures collectively comprise:

at least two and up to N different values of x, and/or at least two and up to N different thicknesses.

5. The HEMT of claim 1, wherein the second group III nitride comprises $Al_yR_zGa_{1-y-z}N$, wherein $0.6 \leq y \leq 1.0$, $0 \leq z \leq 0.4$, and R is selected from the group consisting of: B and Sc.

6. The HEMT of claim 5, wherein the top and bottom barrier layers of the nanowire or nanosheet heterostructures collectively comprise:

at least two and up to N different values of y, and/or at least two and up to N different values of z, and/or at least two and up to N different thicknesses.

7. The HEMT of claim 1, where the nanowire or nanosheet heterostructures are undoped.

8. The HEMT of claim 1, wherein the stack of nanowire or nanosheet heterostructures is a stack of nanowire heterostructures, and wherein the gate electrode surrounds each of the nanowire heterostructures, the gate electrode having a gate-all-around configuration.

9. The HEMT of claim 8, wherein the stack of nanowire heterostructures is a first stack, and further comprising a second stack of nanowire heterostructures laterally spaced apart from the first stack and suspended between the source and the drain, the nanowire heterostructures of the second stack being vertically separated from each other.

10. The HEMT of claim 1, wherein the stack of nanowire or nanosheet heterostructures is a stack of nanosheet heterostructures, and wherein the gate electrode comprises a top gate overlying each nanosheet heterostructure and a bottom gate underlying each nanosheet heterostructure, the top and bottom gates having a dual-gate configuration.

11. The HEMT of claim 1, wherein the dielectric layer has a thickness in a range from about 2 nm to about 10 nm, and wherein the dielectric layer comprises $Al_2O_3$ and/or $HfZrO_2$.

12. The HEMT of claim 1, wherein a length of the gate electrode is in a range from about 30 nm to about 70 nm, and wherein the substrate comprises GaN.

13. The HEMT of claim 1, wherein the source and the drain comprise $In_xGa_{1-x}N$, wherein $0 \leq x \leq 0.5$, the source and the drain having a graded composition where x increases in a direction away from the substrate.

14. The HEMT of claim 13, wherein the $In_xGa_{1-x}N$ comprises Si, Te, and/or Se as a dopant, and wherein the $In_xGa_{1-x}N$ is heavily doped, the $In_xGa_{1-x}N$ comprising a dopant at a concentration of at least about $1 \times 10^{18}/cm^3$.

15. The HEMT of claim 1, wherein each nanowire or nanosheet heterostructure comprises a 2D electron gas.

16. The HEMT of claim 1 comprising a cut-off frequency of at least about 25 GHz.

17. The HEMT of claim 1 having a maximum output power of at least about 300 mW/mm per nanowire or nanosheet heterostructure.

18. A power amplifier for use at frequencies above 90 GHz, the power amplifier comprising the HEMT of claim 1.

19. A method of making a high electron mobility transistor (HEMT), the method comprising:

epitaxially growing a stack of layers on a substrate, the stack of layers including N sacrificial layers comprising a sacrificial material alternating with N heterostructure layers, each of the heterostructure layers comprising a first group III nitride and a second group III nitride, where N is an integer and $2 \leq N \leq 50$;

forming a source and a drain on the substrate alongside the stack of layers on a first side and a second side thereof, respectively, the stack of layers connecting the source and the drain;

removing the sacrificial layers comprising the sacrificial material so as to isolate the heterostructure layers, thereby forming a stack of nanosheet heterostructures suspended between the source and the drain and being vertically separated from each other in an air-bridge formation;

forming a gate dielectric layer on each of the nanosheet heterostructures; and forming a gate electrode on the gate dielectric layer.

20. A method of making a high electron mobility transistor (HEMT), the method comprising:

epitaxially growing a stack of layers on a substrate, the stack of layers including N sacrificial layers comprising a sacrificial material alternating with N heterostructure layers, each of the heterostructure layers comprising a first group III nitride and a second group III nitride, where N is an integer and $2 \leq N \leq 50$;

forming a source and a drain on the substrate alongside the stack of layers on a first side and a second side thereof, respectively, the stack of layers connecting the source and the drain;

removing material from a third side and a fourth side of the stack of layers to define a stack of wires of a predetermined width connecting the source and the drain, the stack of wires comprising sacrificial nanowires of the sacrificial material alternating with heterostructure nanowires comprising the first group III nitride and the second group III nitride; and removing the sacrificial nanowires comprising the sacrificial material so as to isolate the heterostructure nanowires, thereby forming a stack of nanowire heterostructures suspended between the source and the drain and being vertically separated from each other in an air-bridge formation;

forming a gate dielectric layer on each of the nanowire heterostructures; and forming a gate electrode on the gate dielectric layer.

21. The HEMT of claim 1, comprising a positive threshold voltage.

* * * * *